(12) United States Patent
Won et al.

(10) Patent No.: US 9,840,663 B2
(45) Date of Patent: Dec. 12, 2017

(54) GLASS COMPOSITION FOR PHOTO-CONVERSION MEMBER AND CERAMIC PHOTO-CONVERSION MEMBER USING THE SAME

(71) Applicant: LG INNOTEK CO., LTD., Seoul (KR)

(72) Inventors: Ju Yeon Won, Seoul (KR); Jin Gyeong Park, Seoul (KR); In Jae Lee, Seoul (KR); Sung Hoon Kim, Seoul (KR); Won Jin Kim, Seoul (KR); Eui Yeol Yang, Seoul (KR)

(73) Assignee: LG INNOTEK CO., LTD, Seoul (KR)

( * ) Notice: Subject to any disclaimer, the term of this patent is extended or adjusted under 35 U.S.C. 154(b) by 0 days.

(21) Appl. No.: 14/607,232

(22) Filed: Jan. 28, 2015

(65) Prior Publication Data

US 2015/0210919 A1    Jul. 30, 2015

(30) Foreign Application Priority Data

Jan. 29, 2014 (KR) .................. 10-2014-0010997
Feb. 3, 2014 (KR) .................. 10-2014-0012052
Feb. 3, 2014 (KR) .................. 10-2014-0012166

(51) Int. Cl.

| C03C 8/08 | (2006.01) |
|---|---|
| C03C 3/066 | (2006.01) |
| C09K 11/02 | (2006.01) |
| C03C 8/04 | (2006.01) |
| H01L 33/50 | (2010.01) |
| C03C 14/00 | (2006.01) |

(52) U.S. Cl.
CPC .............. *C09K 11/02* (2013.01); *C03C 3/066* (2013.01); *C03C 8/04* (2013.01); *C03C 8/08* (2013.01); *C03C 14/006* (2013.01); *H01L 33/501* (2013.01); *C03C 2204/00* (2013.01); *C03C 2209/00* (2013.01); *C03C 2214/16* (2013.01); *H01L 33/505* (2013.01); *H01L 33/507* (2013.01)

(58) Field of Classification Search
CPC .. C03C 3/066; C03C 8/04; C03C 8/08; C03C 4/006; C03C 2214/06; C03C 2204/00; C03C 2209/00; C03C 14/006; H01L 33/501; H01L 33/505; H01L 33/507; C09K 11/00; C09K 11/02; C09K 11/7706; H05B 33/14; H05B 33/00
See application file for complete search history.

(56) References Cited

U.S. PATENT DOCUMENTS

| 3,207,706 A | 9/1965 | Hoffman | |
|---|---|---|---|
| 2012/0057337 A1* | 3/2012 | Liebald | C09K 11/7774 362/231 |
| 2013/0256598 A1 | 10/2013 | Aitken et al. | |
| 2015/0008816 A1* | 1/2015 | Yoon | C09K 11/025 313/503 |
| 2016/0282479 A1* | 9/2016 | Tanino | G01T 1/20 |

FOREIGN PATENT DOCUMENTS

| DE | 1 490 160 A1 | 9/1969 |
|---|---|---|
| EP | 2 905 266 A1 | 8/2015 |
| JP | 2001199737 A * | 7/2001 |
| JP | 2005-320227 A | 11/2005 |
| JP | 2011187798 A * | 9/2011 |
| KR | 101432479 B1 * | 8/2014 |
| WO | WO 2011/111462 A1 | 9/2011 |
| WO | WO 2014/178515 A1 | 11/2014 |

OTHER PUBLICATIONS

Machine Translation of JP 2005-320227 A published Nov. 17, 2005.*
European Search Report dated Oct. 9, 2015 issued in Application No. 15153118.3.

* cited by examiner

*Primary Examiner* — Elizabeth A Bolden
(74) *Attorney, Agent, or Firm* — KED & Associates, LLP

(57) ABSTRACT

Provided are a ternary glass composition containing $SiO_2$, $B_2O_3$ and ZnO, and a ceramic phosphor plate including a glass frit obtained by vitrification of the glass composition as a matrix and obtained by sintering at least one phosphor.

11 Claims, 13 Drawing Sheets

[FIG. 1]
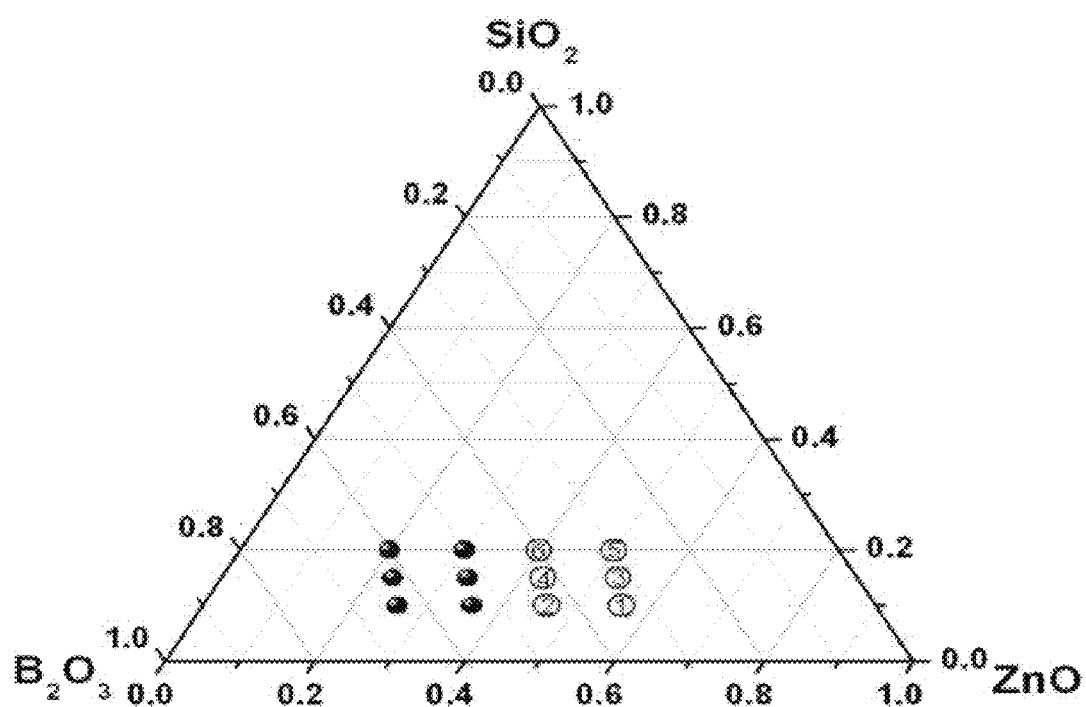

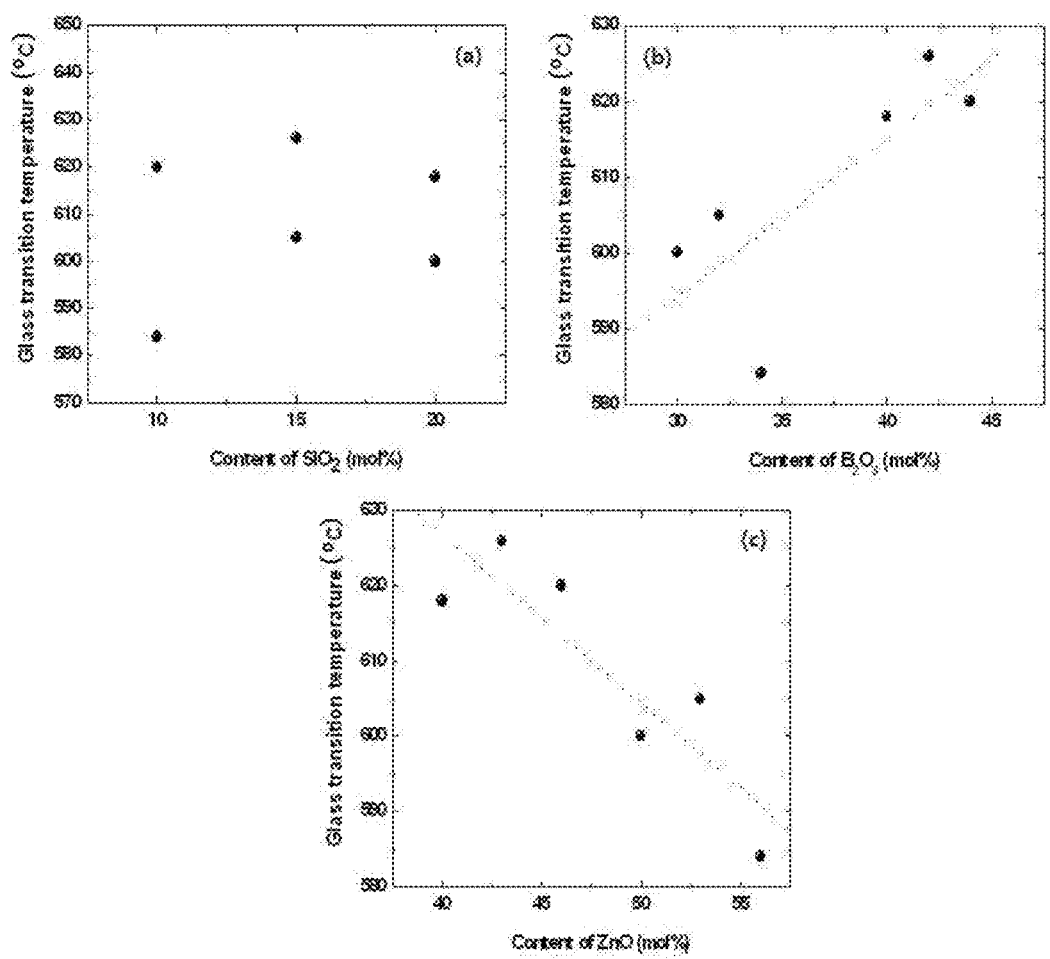
[FIG. 2]

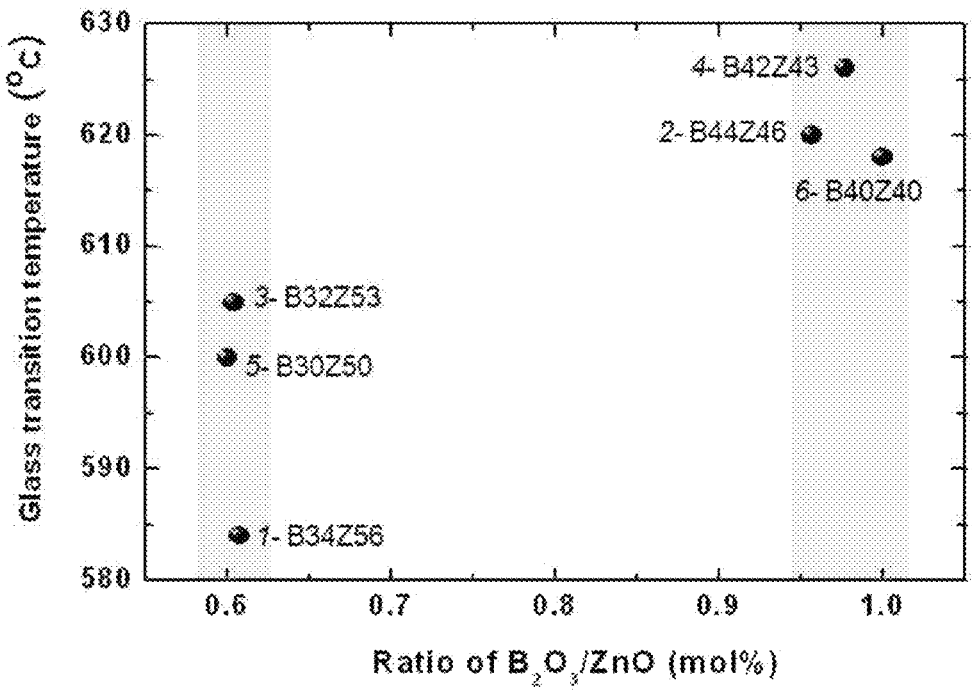
[FIG. 3]
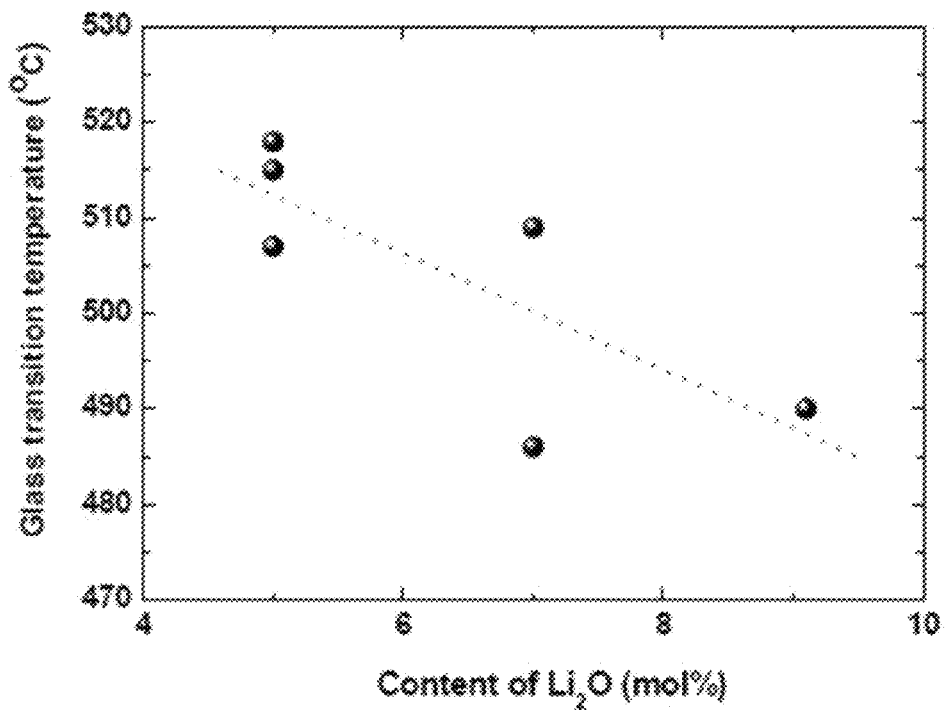
[FIG. 4]

[FIG. 5]
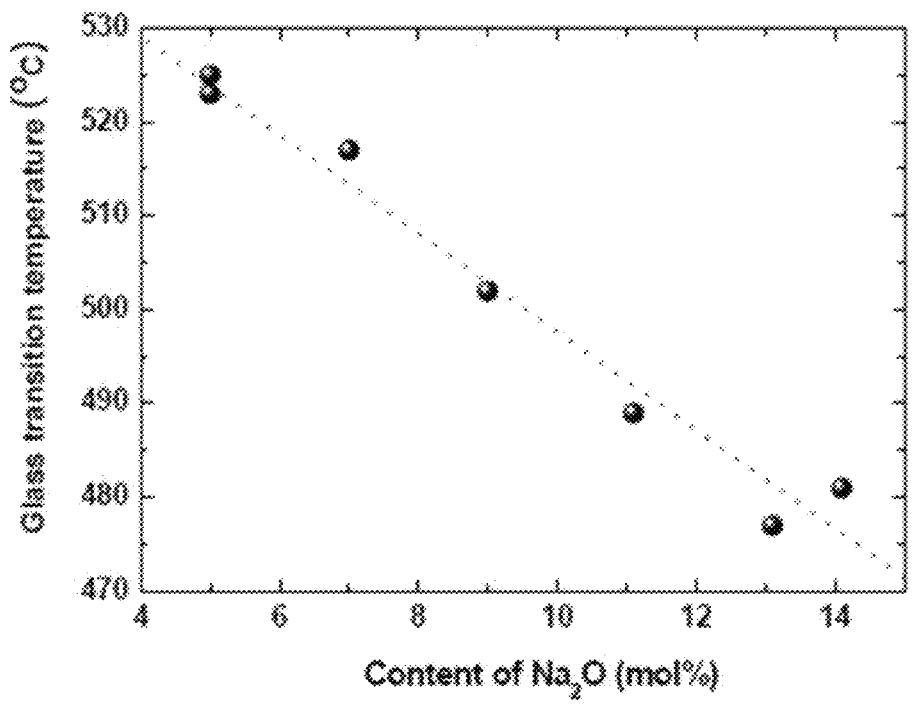
[FIG. 6]
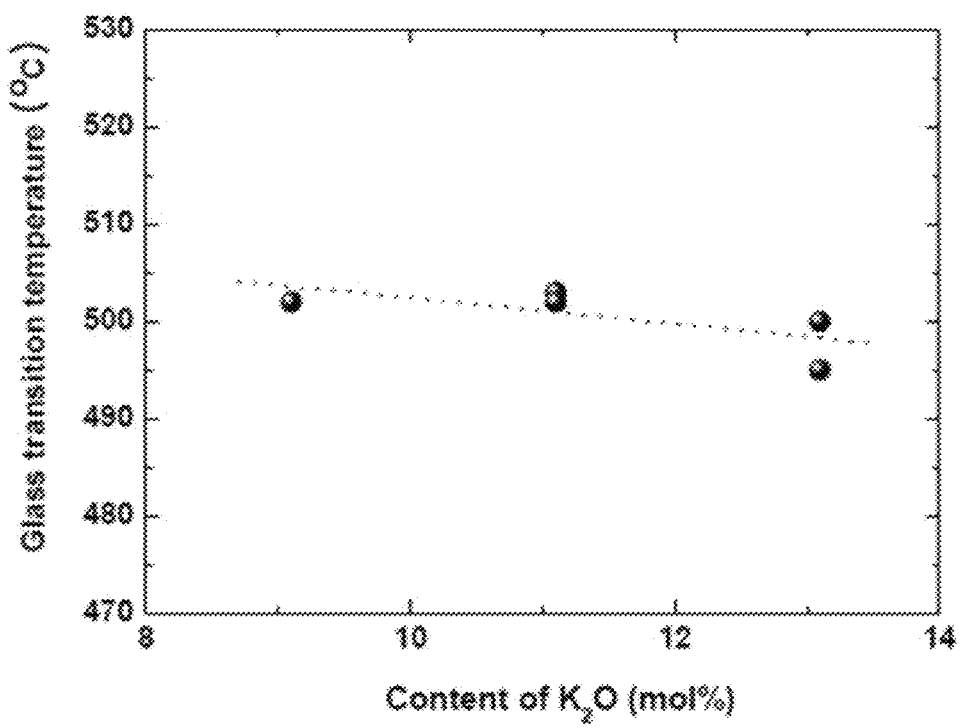

[FIG. 7]
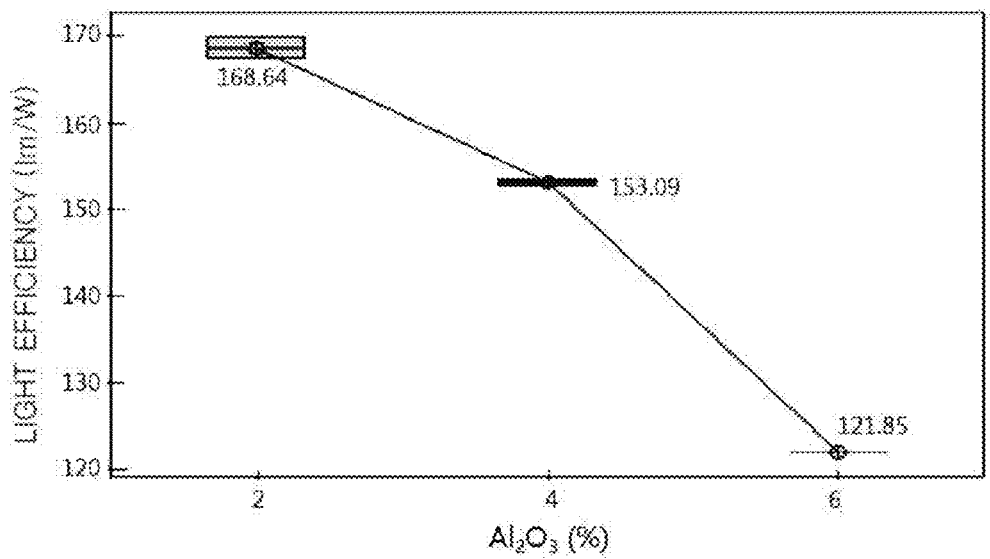
[FIG. 8]
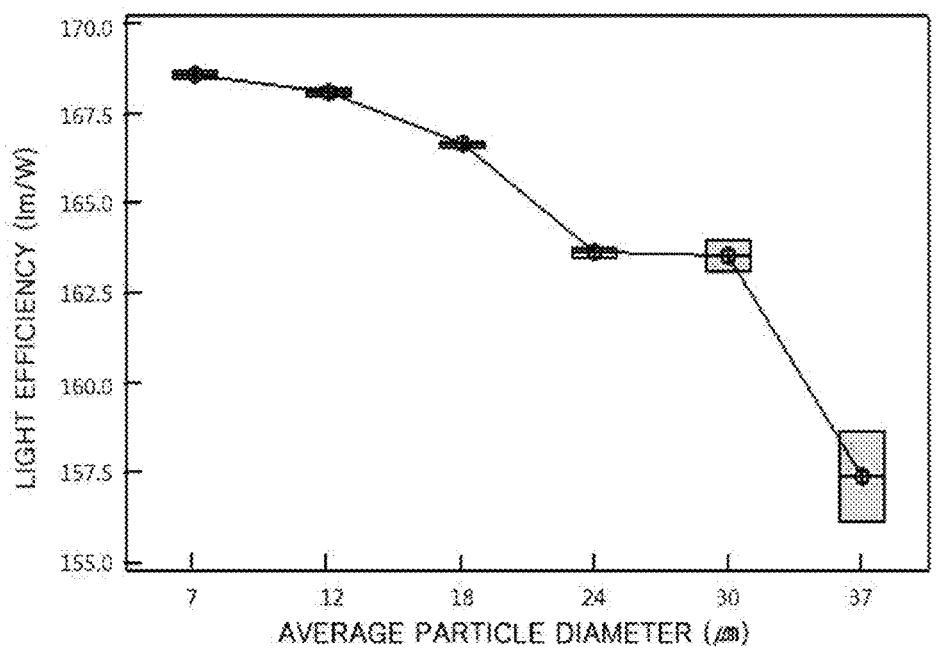

[FIG. 9]
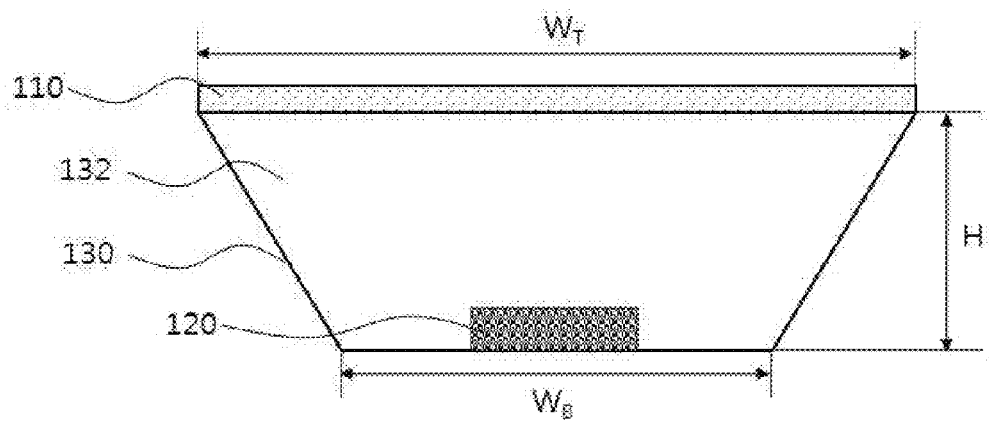
[FIG. 10]
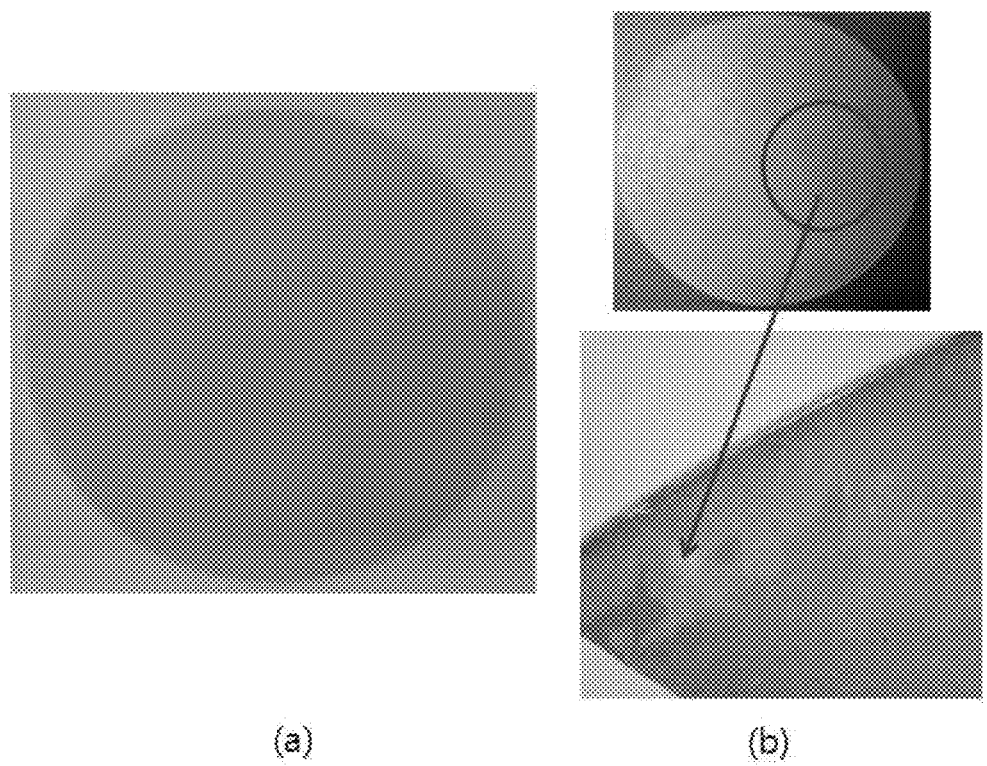
(a)　　　　　　　　　(b)

[FIG. 11]
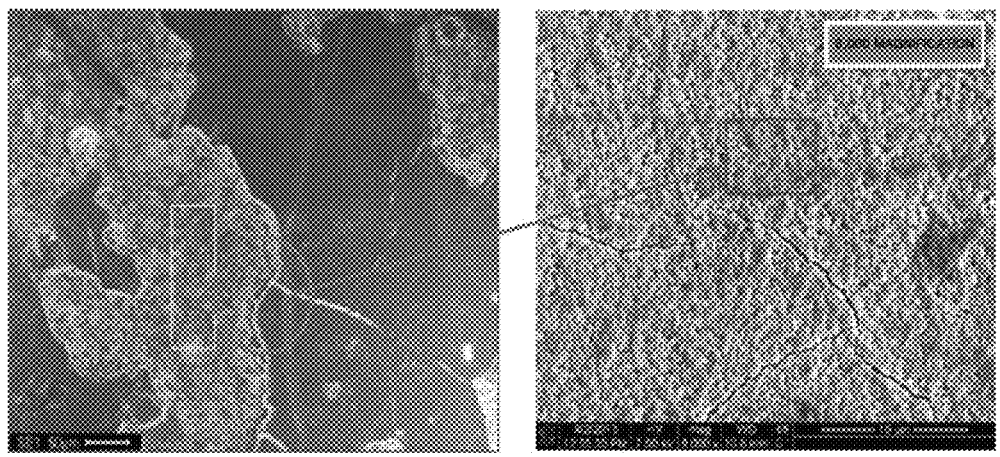
[FIG. 12]
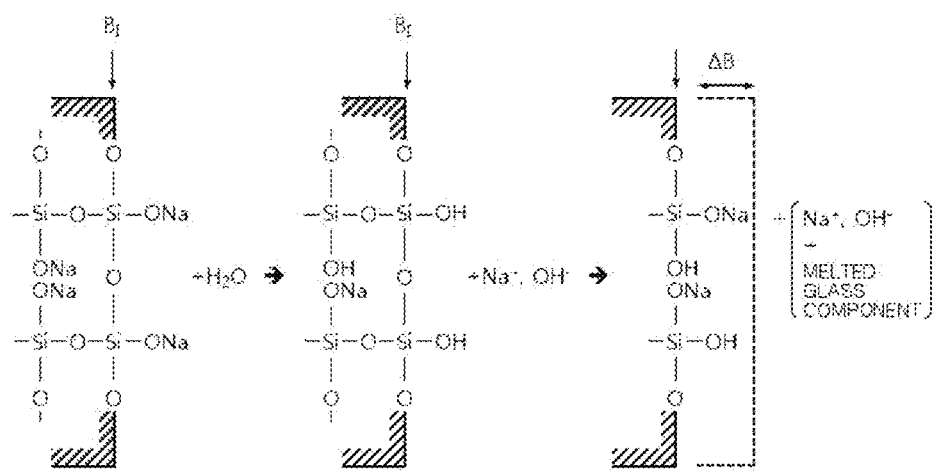

[FIG. 13]
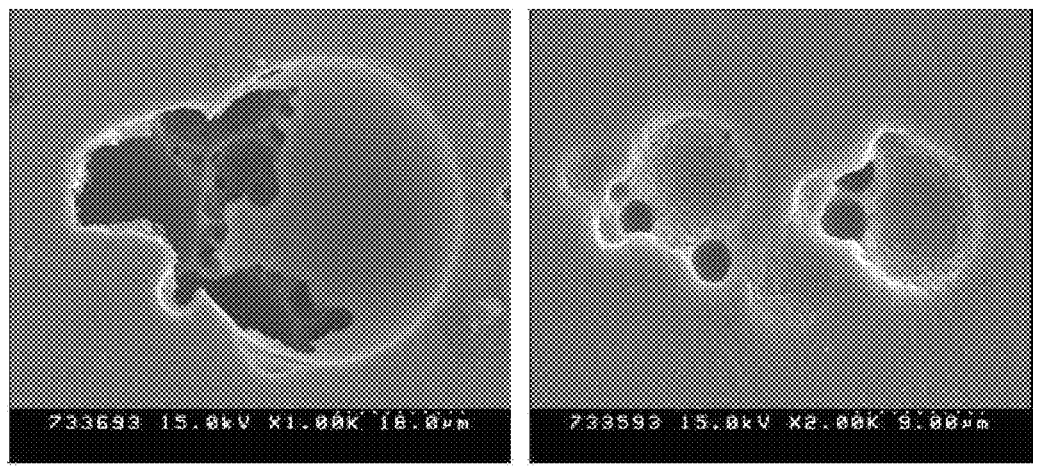
[FIG. 14]
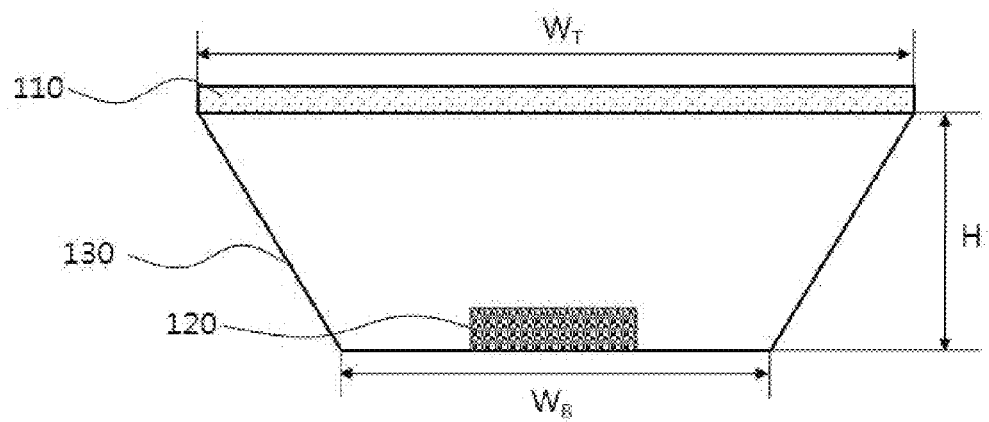

[FIG. 15]
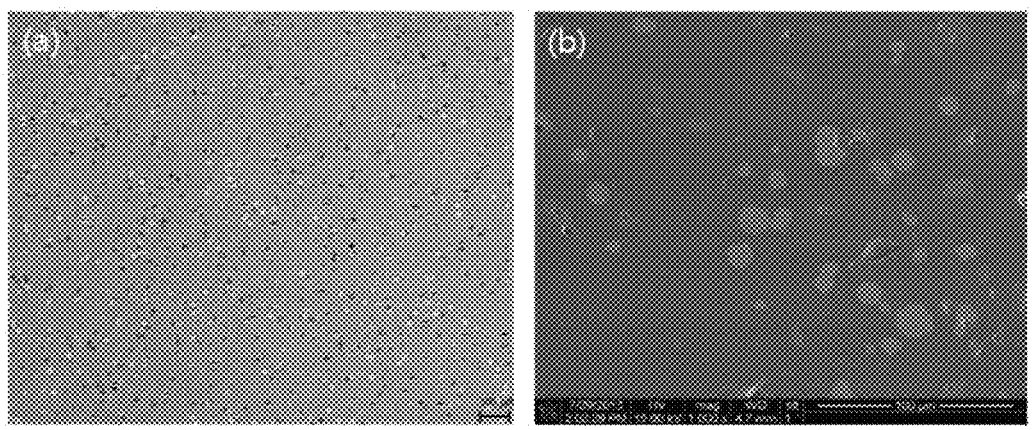
[FIG. 16]
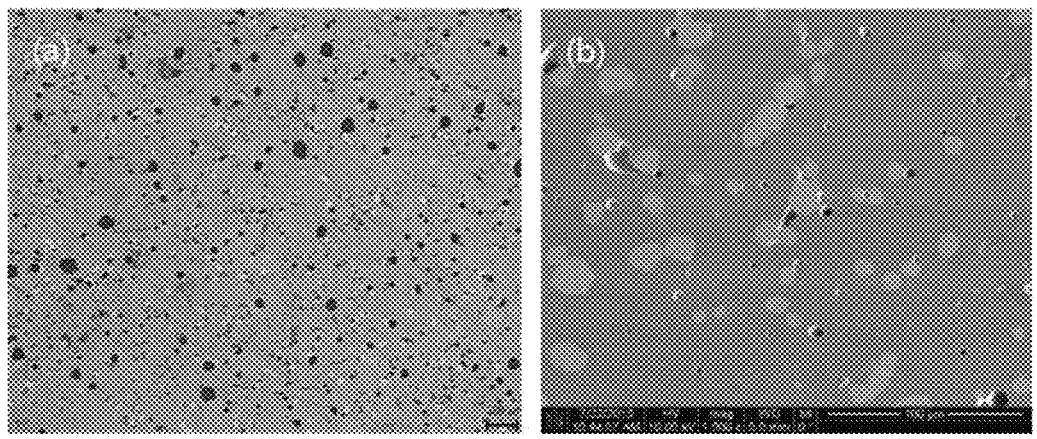

[FIG. 17]
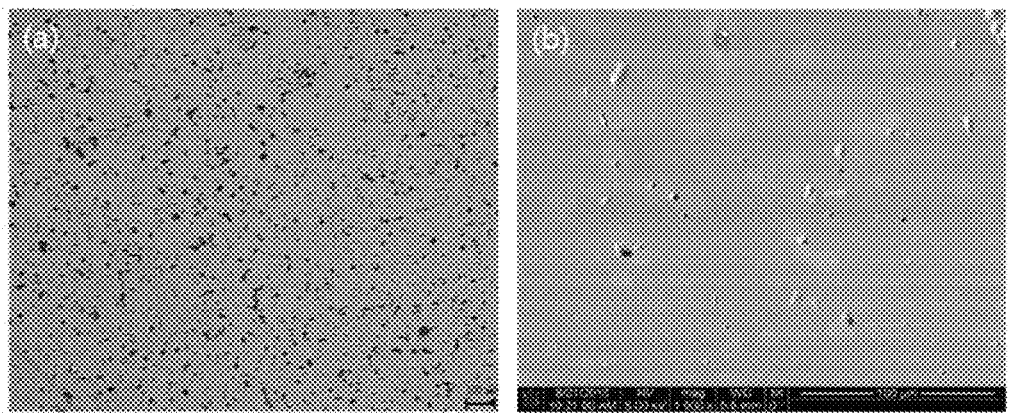
[FIG. 18]
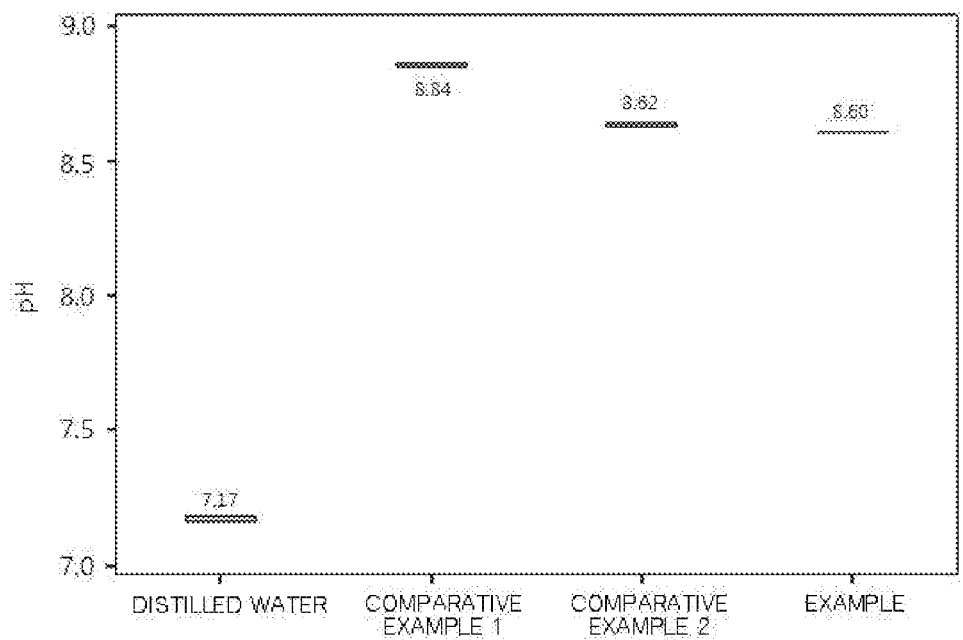

[FIG. 19]
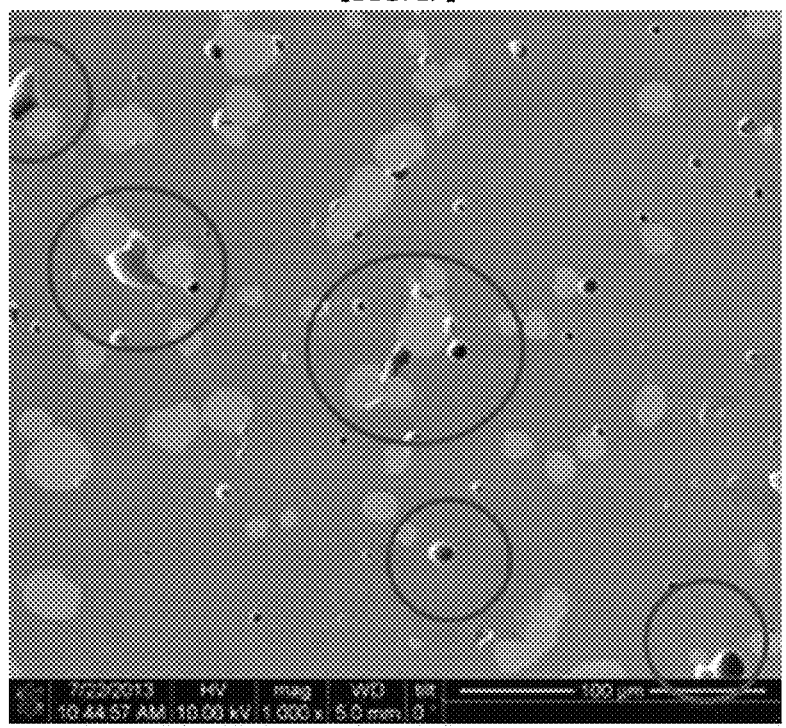
[FIG. 20]
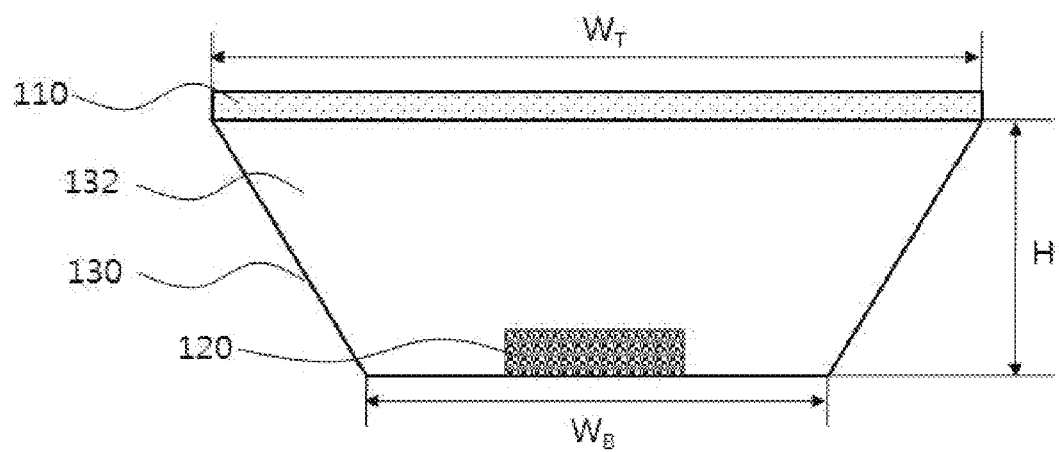

[FIG. 21]
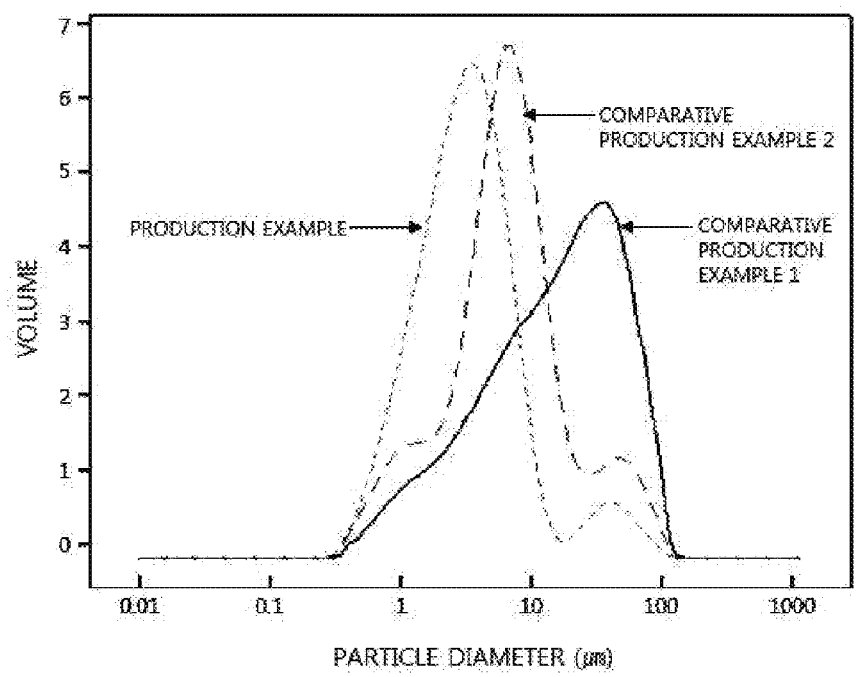
[FIG. 22]
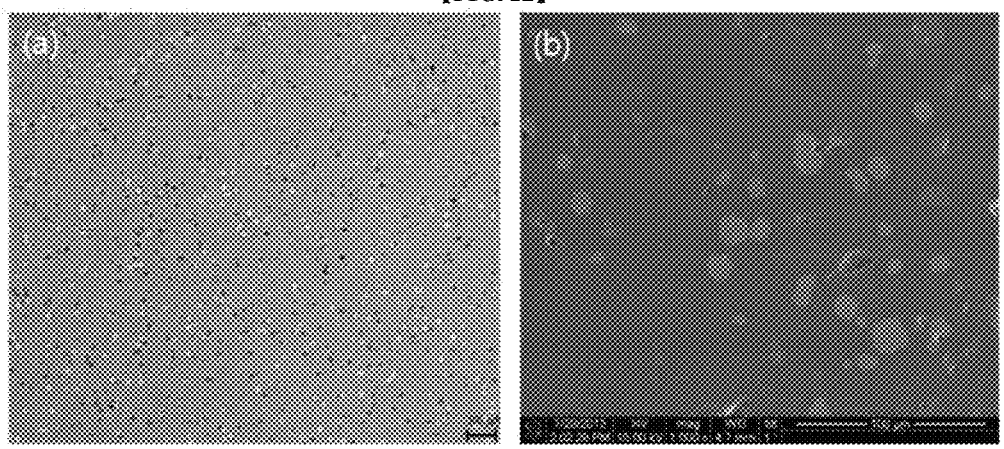

[FIG. 23]
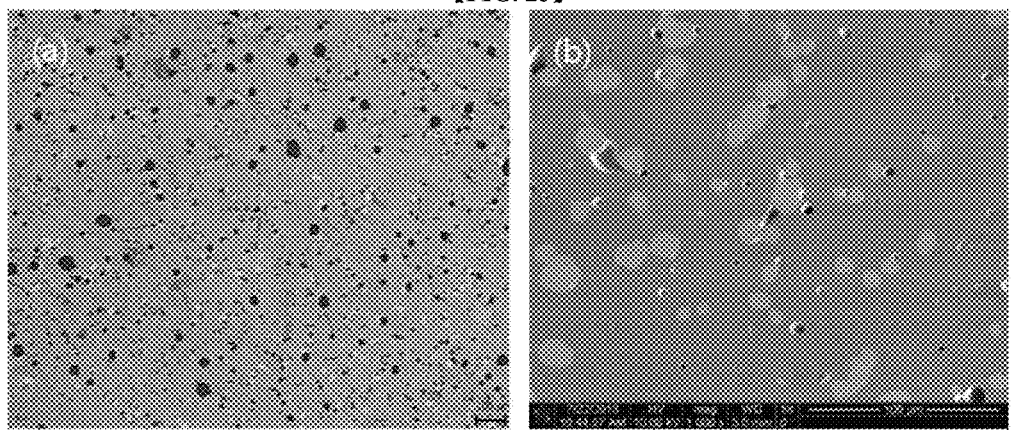
[FIG. 24]
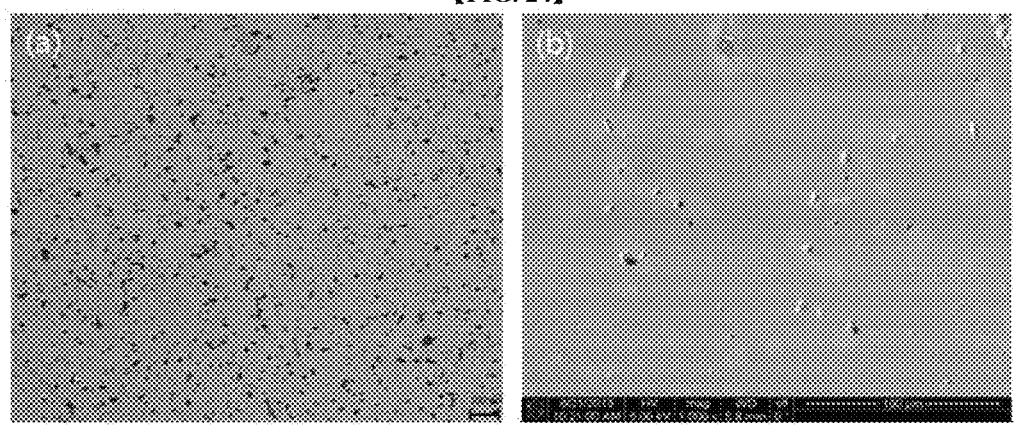

GLASS COMPOSITION FOR PHOTO-CONVERSION MEMBER AND CERAMIC PHOTO-CONVERSION MEMBER USING THE SAME

CROSS-REFERENCE TO RELATED APPLICATIONS

This application claims the benefit under 35 U.S.C. §119 of Korean Patent Application Nos. 10-2014-0010997, filed on Jan. 29, 2014; 10-2014-0012052, filed on Feb. 3, 2014; and 10-2014-0012166, filed on Feb. 3, 2014 which are hereby incorporated by reference in their entirety.

BACKGROUND

1. Field

Embodiments of the present disclosure relate to a glass composition constituting a photo-conversion member of a lighting device, and a glass frit resulting from vitrification and pulverization of the glass composition.

2. Background

A white LED (Light Emitting Diode) is in the spotlight as a light source for white lighting having high efficiency and high reliability and has been already partially used as a small sized light source having small power consumption. Even though there are various methods of implementing a white LED, the most commonly used method is a method of molding a blue LED element with a matrix made of resin with a yellow phosphor. However, since blue light has strong energy, it may easily cause deterioration of the resin. Accordingly, since the white LED having such a structure causes discoloration of the resin when being used for a long time, the color of light emitted from the white LED is changed. Also, since the molding is performed with resin, heat emission from the element may not be easily performed, so it is easy to increase a temperature. Due to this increase of the temperature, it is problematic in that the color of emitted light is changed to yellow.

In order to solve these problems, a phosphor plate in which a ceramic pellet is used as the matrix material of a phosphor has been applied. The phosphor used in such a phosphor plate is only limited to an oxide phosphor, in particular, a YAG (Yttrium Aluminum Garnet) phosphor. When merely the oxide phosphor is used, it is difficult to implement various color coordinates and color temperatures. Also, when merely a phosphor such as YAG and the like is applied, a heat-resisting temperature is required to be 800° C. or more, and accordingly, the compositional condition of glass is not needed to become complicated. However, in order to implement various color temperatures, a red phosphor and a yellow phosphor should be mixed in an appropriate amount. To do so, there is a need to adjust the compositional condition of glass in order to reduce a sintering temperature because these phosphors are vulnerable to heat.

Also, when a glass composition is applied to a photo-conversion member for vitrification of the glass composition, porosity serves as a factor that has an influence on durability and light efficiency of the photo-conversion member. That is, pores (parts indicated into circles in FIG. 19) on a surface or in an inner portion of the photo-conversion member are damaged by a thermal shock or moisture.

BRIEF DESCRIPTION OF THE DRAWINGS

The embodiments will be described in detail with reference to the following drawings in which like reference numerals refer to like elements wherein:

FIG. 1 is a ternary diagram of a ternary glass composition according to an embodiment of the present disclosure;

FIG. 2 is a graph illustrating glass transition temperatures Tg regarding a content of each component of the ternary glass composition according to the embodiment of the present;

FIG. 3 is a graph illustrating a glass transition temperature Tg regarding a ratio of $B_2O_3$ to ZnO contained in the ternary glass composition according to the embodiment of the present disclosure;

FIG. 4 is a graph illustrating a glass transition temperature Tg regarding a content of $Li_2O$ contained in a multicomponent glass composition according to an embodiment of the present disclosure;

FIG. 5 is a graph illustrating a glass transition temperature Tg regarding a content of $Na_2O$ contained in the multicomponent glass composition according to the embodiment of the present disclosure;

FIG. 6 is a graph illustrating a glass transition temperature Tg regarding a content of $K_2O$ contained in the multicomponent glass composition according to the embodiment of the present disclosure;

FIG. 7 is a graph illustrating a light efficiency regarding a content of $Al_2O_3$ contained in the multicomponent glass composition according to the embodiment of the present disclosure;

FIG. 8 is a graph illustrating a light efficiency according to each average particle size of a glass pellet according to an embodiment of the present disclosure;

FIG. 9 is a cross-sectional view illustrating a sketch structure of an integrating sphere for the purpose of optical property evaluation according to an embodiment of the present disclosure;

FIG. 10 is a photo resulting from observing and capturing states (A) and (B) before and after putting a conventional phosphor plate into the test of reliability under a high-temperature and humidity environment;

FIG. 11 is a photo resulting from observing and capturing a surface of the conventional phosphor plate using a scanning electron microscope (SEM) after putting the conventional phosphor plate into the test of reliability under a high-temperature and humidity environment;

FIG. 12 is a mimetic diagram illustrated for explaining a mechanism in which whitening is generated from the conventional phosphor plate;

FIG. 13 is a photo resulting observing and capturing pores formed on the surface of the conventional phosphor plate using an SEM (Scanning Electron Microscope);

FIG. 14 is a cross-sectional view showing an integrating sphere intended for measuring an optical property of a ceramic phosphor plate according to an embodiment of the present disclosure;

FIG. 15 is a photo resulting from observing the surface of a photo-conversion member produced in an example of the present disclosure using an optical microscope (A) and an SEM (Scanning Electron Microscope) (B);

FIG. 16 is a photo resulting from observing the surface of a photo-conversion member produced in a comparative example using an optical microscope (A) and an SEM (Scanning Electron Microscope) (B);

FIG. 17 is a photo resulting from observing the surface of a photo-conversion member produced in another comparative example using an optical microscope (A) and an SEM (Scanning Electron Microscope) (B);

FIG. 18 is a graph resulting from floating a pH measured through an ion elution test according to an example of the present disclosure and comparative examples;

FIG. 19 is a photo resulting from observing a cross section of a conventional photo-conversion member using an SEM (Scanning Electron Microscope);

FIG. 20 is a cross-sectional view of an integrating sphere for measuring an optical property of a ceramic photo-conversion member according to another embodiment of the present disclosure;

FIG. 21 is a graph showing particle size distribution of a glass frit produced in each of an example of the present disclosure and comparative examples;

FIG. 22 is a photo resulting from observing the surface of a photo-conversion member produced in an example of the present disclosure using an optical microscope (A) and an SEM (Scanning Electron Microscope) (B);

FIG. 23 is a photo resulting from observing the surface of a photo-conversion member produced in Comparative Example 1 using an optical microscope (A) and an SEM (Scanning Electron Microscope) (B); and FIG. 24 is a photo resulting observing the surface of a photo-conversion member produced in Comparative Example 2 using an optical microscope (A) and an SEM (Scanning Electron Microscope) (B).

DETAILED DESCRIPTION

Hereinafter, the configurations and operations according to embodiments of the present disclosure will be described in detail with reference to the accompanying drawings. The present disclosure may, however, be embodied in different forms and should not be construed as limited to the embodiments set forth herein. In the explanation with reference to the accompanying drawings, regardless of reference numerals of the drawings, like numbers refer to like elements through the specification, and repeated explanation thereon is omitted. Terms such as a first term and a second term may be used for explaining various constitutive elements, but the constitutive elements should not be limited to these terms. These terms are only used for the purpose for distinguishing a constitutive element from other constitutive element. As used herein, the singular forms "a," "an" and "the" are intended to include the plural forms as well, unless the context clearly indicates otherwise.

1. Glass Composition for Photo Conversion Member (Ternary System)

FIG. 1 is a ternary diagram of a ternary glass composition according to an embodiment of the present disclosure.

The ternary glass composition according to the present embodiment contains $SiO_2$, $B_2O_3$, and $ZnO$. Referring to FIG. 1, the components of the ternary glass composition according to the present embodiment are indicated at each vertex showing a ternary system, and a content of each component is indicated at each side. Six black points inside the diagram refer to points in which glass is not formed. On the contrary, component points ① to ⑥ refer to compositional conditions in which glass is formed. $B_2O_3$ is contained in a content of 35 to 45 mol % in the ternary glass composition according to the present embodiment. Also, $ZnO$ is contained in a content of 40 to 60 mol % in the ternary glass composition. In the ternary glass composition according to the present embodiment, the properties of a glass and phosphor plate after sintering are largely influenced by a content ratio of $ZnO$ to $B_2O_3$. The content ratio of $ZnO$ to $B_2O_3$ may be range from 0.6 to 1.

In order to reduce a sintering temperature upon manufacturing the phosphor plate, a glass frit is formed to have a low glass transition temperature Tg. To do so, it is preferable that the content of $B_2O_3$ be low and the content of $ZnO$ be high. On the contrary, a correlation between $SiO_2$ and the glass transition temperature Tg is low. (A) of FIG. 2 is a graph illustrating a glass transition temperature Tg regarding a content of $SiO_2$ contained in the ternary glass composition according to the embodiment of the present disclosure, (B) of FIG. 2 is a graph illustrating a glass transition temperature Tg regarding a content of $B_2O_3$, and (C) of FIG. 2 is a graph illustrating a glass transition temperature Tg regarding a content of $ZnO$.

Referring to (A) of FIG. 2, it can be seen that a change of the glass transition temperature Tg is not largely influenced by the content of $SiO_2$. On the contrary, referring to (B) and (C) of FIG. 2, it can be seen that the glass transition temperature is influenced by the content of $B_2O_3$ and the content of $ZnO$. As shown in (B) of FIG. 2, as the content of $B_2O_3$ increases gradually, the glass transition temperature Tg increases. On the contrary, as shown in (C) of FIG. 2, as the content of $ZnO$ increases gradually, the glass transition temperature Tg reduces.

FIG. 3 is a graph illustrating a glass transition temperature Tg regarding a ratio of $B_2O_3$ to $ZnO$ contained in the ternary glass composition according to the embodiment of the present disclosure.

Referring to FIG. 3, it can be seen that the content ratio of $ZnO$ to $B_2O_3$ has an influence on adjustment of the glass transition temperature Tg (in the content ratios indicated as Nos. 1 to 6, B refers to $B_2O_3$, Z refers to $ZnO$, and the number in two digits refers to mol %). As can be seen from the graph of FIG. 3, it can be seen that when the content ratio of $ZnO$ to $B_2O_3$ is about 0.6, the ternary glass composition has a low glass transition temperature Tg. At this time, the content ratio and the effect resulting from the content ratio may be only applied to the glass composition composed of only a ternary system such as $SiO_2$—$B_2O_3$—$ZnO$.

A multicomponent glass composition according to another aspect of the present embodiment contains at least one alkali metal oxide in an oxide mixture composed of silicon oxide, boric oxide and zinc oxide in order to obtain the effect of a glass transition temperature Tg. The alkali metal oxide may be $Na_2O$, $Li_2O$, $K_2O$ or a mixture thereof. The alkali metal oxide may be contained in an amount of 5 to 25 mol % in the multicomponent glass composition. The amount may be changed according to the type of the alkali metal oxide.

When a single component is contained in the alkali metal oxide, a ratio of $SiO_2$ to the alkali metal oxide may be 1:0.3 to 1:1.2. Preferably, a ratio of $SiO_2$ to the alkali metal oxide may be 1:0.5 to 1:1.

For example, $Li_2O$ may be contained in an amount of 5 to 10 mol %, $Na_2O$ may be contained in an amount of 5 to 10 mol %, and $K_2O$ may be contained in an amount of 4 to 9 mol %. When the content of the alkali metal oxide is high, glass may not be formed. When the content of the alkali metal oxide is too low, the effect of a reduction of the glass transition temperature Tg may not be expected. At this time, with regard to the ratio of $SiO_2$ to the alkali metal oxide, the ratio of $Li_2O$ may range from 0.3 to 0.7, the ratio of $Na_2O$ may range from 0.3 to 1, and the ratio of $K_2O$ may range from 0.65 to 1.2. In the multicomponent glass composition, when only a single component is contained in the alkali metal oxide, the content of $SiO_2$ should be 13 mol % or more, so glass can be formed.

FIG. 4 is a graph illustrating a glass transition temperature Tg regarding a content of Li2O contained in a quaternary glass composition according to an embodiment of the present disclosure, FIG. 5 is a graph illustrating a glass transition temperature Tg regarding a content of Na2O contained in the quaternary glass composition according to the embodiment of the present disclosure, and FIG. 6 is a graph illustrating a glass transition temperature Tg regarding a content of $K_2O$ contained in the quaternary glass composition according to the embodiment of the present disclosure.

Referring to FIGS. 4 to 6, it can be seen that the glass transition temperature Tg is reduced according to each content of the alkali metal oxide. In particular, in the case of $Na_2O$, a change of the glass transition temperature Tg is larger than that of each of $Li_2O$ and $K_2O$. That is, in the alkali metal oxide, when merely a single material is used, a high change of the glass transition temperature may be generated by adding $Na_2O$.

In order to improve a thermal property in addition to the glass transition temperature Tg, at least two kinds of alkali metal oxides may be added. However, when at least two kinds of alkali metal oxides are added, a different result from that shown in each graph illustrated in FIGS. 4 to 6 may be generated. When at least two kinds of alkali metal oxides are added, a total content of the alkali metal oxides may be 10 to 25 mol %. In order to reduce an additional firing temperature, two kinds of the alkali meal oxides are multiply applied, and glass composed of multi components beyond five components, namely, a ternary oxide mixture and at least two kinds of alkali metal oxides may not be obtained by merely an increase of each components. That is, when a content ratio based on the ternary system is used, the glass may not be formed.

In a multi-component system containing at least five components, in order to form glass, the silicon oxide should be contained in an amount of 10 to 40 mol %. When the content of the silicon oxide is 25 mol % or more, the total content of the alkali metal oxides should be 20 mol % or more in order to meaningfully reduce the glass transition temperature Tg. Also, in the multi-component system containing at least five components, a trivalent metal oxide may be further included in order to increase chemical resistance. $Al_2O_3$ may be used as the trivalent metal oxide. FIG. 7 is a graph illustrating a light efficiency regarding a content of $Al_2O_3$ contained in the multicomponent glass composition according to the embodiment of the present disclosure. When $Al_2O_3$ is added in an amount of more than 2 mol % as illustrated in FIG. 7, light efficiency may be remarkably reduced.

A glass frit according to another aspect of the present embodiment is obtained by vitrification and pulverization of the glass composition including at least one alkali metal oxide in an oxide mixture composed of $SiO_2$, $B_2O_3$ and ZnO in order to obtain the effect of a glass transition temperature Tg.

After weighing of materials such as the oxide mixture and the alkali metal oxide has been performed, the glass frit is mixed with the materials for 40 to 50 hours using a ball mill, and then the mixture is put in a melting furnace. A melting process can be performed by adjusting a melting temperature according to each compositional condition of the glass composition. At this time, the melting temperature may be 1300 to 1600° C., and glass may be produced according to a conventional glass manufacturing process. The melting process is performed by selecting a temperature for enabling uniform dissolution of the materials contained in the glass composition. At this time, when the temperature is increased by more than 1600° C., the amount of a volatile component may be increased. The melted material is put in a twin roll and is subjected quenching to prepare a glass cullet. The glass frit is prepared by pulverizing the glass cullet.

The pulverizing method is divided into a dry pulverization method and a wet pulverization method. Examples of the dry pulverization method include methods using a ball mill, a vibration mill and the like. $Al_2O_3$ or $ZrO_2$ is generally used in a ceramic ball used in the ball mill method. Since the vibration mill method uses a vibration movement, the vibration mill has a large impact generated when the vibration mill is caught on a pulverized material. The wet pulverization method is a method of performing pulverization by stirring the pulverized material in a fluid and a ball. The wet pulverization may enable fine pulverizing compared to the dry pulverization. In addition to the ball mill, a medium agitation mill and a bead mill are used. The bead mill is a pulverizer in which a ceramic bead having a diameter of 0.5 to 2.0 mm and high wear resistance is used. An organic solvent such as water or ethanol may be used as the liquid used in the wet pulverization. In the case of glass having high water resistance, water is mainly used. In a case where a change in components may be generated upon using water, an organic solvent may be used.

The glass frit according to the present embodiment may have an average particle diameter of 1 to 20 μm, preferably, 2 to 10 μm. As shown in FIG. 8, when the glass frit has a small particle diameter, internal porosity of the glass frit after sintering is reduced so that an optical property can be improved. In a case where the particle diameter of the glass frit is more than 20 μm, various pores may be formed upon performing sintering by mixing the glass frit with a phosphor later. On the contrary, when the particle diameter of the glass frit is less than 1 μm, the glass frit may not be sufficiently dispersed upon mixing with the phosphor. Thus, passivation of the phosphor may not be sufficiently performed. Furthermore, according to a milling time increase, since the degree of pollution is increased, it is difficult to maintain a whiteness index after sintering.

The ceramic photo-conversion member according to another aspect of the present embodiment is obtained by sintering at least one ceramic phosphor with the glass frit as a matrix.

According to a desired optical property, the color of lighting, an application field and the like, the ceramic phosphor may be one phosphor of a yellow phosphor, a green phosphor and a red phosphor. According to circumstances, the ceramic phosphor may be at least two kinds of phosphors in which beams having different wavelengths are excited. An yttrium aluminum garnet (YAG)-based phosphor, a lutetium aluminum garnet (LuAG)-based phosphor, a nitride-based phosphor, a sulfide-based phosphor or a silicate-based phosphor may be used as the ceramic phosphor.

The ceramic phosphor is mixed in an amount of 1 to 10 mol % with respect to the glass frit. At this time, according to each transmittance and color difference after sintering, the amount of the mixed phosphor may be slightly changed. Also, according to the change of a thickness, the content of the phosphor may be changed. When the thickness of the phosphor is increased, the amount of the phosphor may be reduced.

The mixture of the glass frit and the ceramic phosphor is put into a SUS (Stainless Use Steel) mold and is subjected to uniaxial compression to have a plate or disc form. At this time, the compression is performed at 7 tons for 5 minutes. The mixture of the compressed inorganic phosphor-glass powder is subjected to firing in a state of being put in a firing furnace. A temperature and time for firing may be adjusted according to each glass transition temperature Tg of the inorganic phosphor and the glass powder.

The ceramic photo-conversion member subjected to sintering may be further subjected to surface polishing in order to adjust a thickness and a surface roughness appropriate for properties required in the embodiment. At this time, the ceramic photo-conversion member is ground until the ceramic photo-conversion member has a thickness of 200 to 1000 μm and a surface roughness of 0.1 to 0.3 μm.

FIG. 9 is a cross-sectional view illustrating the sketchy structure of an integrating sphere for an optical property test according to an embodiment of the present disclosure.

Referring to FIG. 9, the integrating sphere for an optical property test according to the present embodiment includes a ceramic photo-conversion member 110. The ceramic photo-conversion member 110 is disposed to be separated from a light source 120. A separation distance between the ceramic photo-conversion member and the light source may range from 10 to 20 mm. The separation distance may be, preferably, 12 to 18 mm. When the separation distance is more than 20 mm, light extraction may not be sufficiently performed. On the contrary, when the separation distance is less than 10 mm, a ceramic phosphor may cause thermal deformation due to heat generated from the light source 120.

The lighting device includes a housing in which a width is gradually increased upwards from a bottom surface with the light source 120 as its center. An optical element for emitting light, such as a solid light emitting element, may be applied as the light source 120. Any one selected from among an LED (Light Emitting Diode), an OLED (Organic Light Emitting Diode), an LD (Laser Diode), a laser, and a VCSEL (Vertical Cavity Surface Emitting Laser) may be applied as the solid light emitting element. The photo-conversion member 110 is provided at an upper end portion of the housing to be separated from a light source 120. As described above, the ceramic photo-conversion member 110 includes a matrix composed of a glass frit and a ceramic phosphor dispersed in the matrix. The inside of the housing 132 may be filled with a material having a higher refractive index than that of the ceramic photo-conversion member 110 or the same refractive index as that of the ceramic photo-conversion member 110.

Also, an optical property may be measured with the integrating sphere having such a form. Light scattered by the interior of the integrating sphere is evenly distributed over all angles, and the integrating sphere enables the light to be distributed on a surface of the integrating sphere with the regular intensity of illumination by entirely collecting light reflected from the surface of a sample. A special paint, a PTFE (polytetrafluoroethylene) or the like may be used as a coating material for an internal wall of the integrating sphere. The interior of the integrating sphere should not be contaminated. In the case of spectral transmittance, when a light transmitted without a sample is 100%, a ratio for completely blocking light using an opaque object such as an iron plate and the like is 0%. When a transmission color has a large dispersion effect in a transmission material, the optical property may be measured using the integrating sphere.

The integrating sphere is prepared in a size in which a WT is 55 to 60 mm, a WB is 35 to 40 mm, and an H is 15 to 20 mm. First, in a state where there is no photo-conversion member 110, the radiant flux of a blue LED corresponding to the light source 120 is measured. Then, the ceramic photo-conversion member 110 is mounted, and a luminous flux (lumens) is measured. When the value of the luminous divided by the value of the radiant flux may give the value of light efficiency.

The present disclosure will be hereinafter described in greater detail based on examples. The examples have been disclosed for illustrative purposes and the present disclosure may, however, be embodied in different forms and should not be construed as limited to the examples set forth herein.

EXAMPLE

Examples 1 to 6: Ternary Glass Composition

Weighing of the materials of $SiO_2$, $B_2O_3$, and ZnO was performed, and thereafter, the materials were put in a ball mill and were then mixed for 48 hours. Mixed powder was put in a platinum crucible and was melted at a temperature of 1300° C. for 30 minutes, and thereafter, the melted material was injected in a twin roller and was subjected to quenching, thereby obtaining a glass cullet. The glass cullet was put into the ball mill again and was pulverized until the glass cullet has a particle diameter of less than 10 μm, thereby obtaining a glass frit. Compositional conditions of each component and measured glass transition temperatures Tg are shown in Table 1 below and FIG. 3.

TABLE 1

| Division | Compositional Condition (mol %) | | | Glass Transition Temperature |
|---|---|---|---|---|
| | $SiO_2$ | $B_2O_3$ | ZnO | $T_g$ (° C.) |
| Example 1 | 10 | 34 | 56 | 584 |
| Example 2 | 10 | 44 | 46 | 620 |
| Example 3 | 15 | 32 | 53 | 605 |
| Example 4 | 15 | 42 | 43 | 626 |
| Example 5 | 20 | 30 | 50 | 600 |
| Example 6 | 20 | 40 | 40 | 618 |

As shown in Table 1 and FIG. 3, it could be seen that when a molar ratio of ZnO to $B_2O_3$ is about 0.6, the glass transition temperature Tg is low.

Examples 7 12: Quaternary Glass Composition—the Addition of $Li_2O$

Weighing of the materials of $SiO_2$, $B_2O_3$, ZnO and $Li_2O$ was performed, and thereafter, the materials were put in a ball mill and were then mixed for 48 hours. Mixed powder was put in a platinum crucible and was melted at a temperature of 1300° C. for 30 minutes, and thereafter, the melted material was injected in a twin roller and was subjected to quenching, thereby obtaining a glass cullet. The glass cullet was put into the ball mill again and was pulverized until the glass cullet has a particle diameter of less than 10 μm, thereby obtaining a glass frit. Compositional conditions of each component and measured glass transition temperatures Tg are shown in Table 2 below and FIG. 4.

TABLE 2

| Division | Compositional Condition (mol %) | | | | Glass Transition Temperature |
|---|---|---|---|---|---|
| | $SiO_2$ | $B_2O_3$ | ZnO | $Li_2O$ | $T_g$ (° C.) |
| Example 7 | 15 | 32 | 46 | 7 | 486 |
| Example 8 | 15 | 27 | 53 | 5 | 507 |
| Example 9 | 15 | 32 | 48 | 5 | 514 |
| Example 10 | 18.2 | 27.3 | 45.4 | 9.1 | 490 |

TABLE 2-continued

| Division | Compositional Condition (mol %) | | | | Glass Transition Temperature |
| --- | --- | --- | --- | --- | --- |
| | $SiO_2$ | $B_2O_3$ | ZnO | $Li_2O$ | $T_g$ (° C.) |
| Example 11 | 20 | 30 | 43 | 7 | 506 |
| Example 12 | 20 | 30 | 45 | 5 | 517 |

Examples 13 to 19: Quaternary Glass Composition—the Addition of $Na_2O$

Weighing of the materials of $SiO_2$, $B_2O_3$, ZnO, and $Na_2O$ was performed, and thereafter, the materials were put in a ball mill and were then mixed for 48 hours. Mixed powder was put in a platinum crucible and was melted at a temperature of 1300° C. for 30 minutes, and thereafter, the melted material was poured in a twin roller and was subjected to quenching, thereby obtaining a glass cullet. The glass cullet was put into the ball mill again and was pulverized until the glass cullet has a particle diameter of less than 10 μm, thereby obtaining a glass frit. Compositional conditions of each component and measured glass transition temperatures Tg are shown in Table 3 below and FIG. 5.

TABLE 3

| Division | Compositional Condition (mol %) | | | | Glass Transition Temperature |
| --- | --- | --- | --- | --- | --- |
| | $SiO_2$ | $B_2O_3$ | ZnO | $Na_2O$ | $T_g$ (° C.) |
| Example 13 | 15 | 32 | 48 | 5 | 525 |
| Example 14 | 15 | 32 | 46 | 7 | 517 |
| Example 15 | 15 | 32 | 44 | 9 | 502 |
| Example 16 | 18.2 | 27.3 | 43.4 | 11.1 | 489 |
| Example 17 | 18.2 | 27.3 | 41.4 | 13.1 | 477 |
| Example 18 | 18.2 | 27.3 | 40.4 | 14.1 | 481 |
| Example 19 | 20 | 30 | 45 | 5 | 523 |

Examples 20 to 24: Quaternary Glass Composition—the Addition of $K_2O$

Weighing of the materials of $SiO_2$, $B_2O_3$, ZnO, and $K_2O$ was performed, and thereafter, the materials were put in a ball mill and were then mixed for 48 hours. Mixed powder was put in a platinum crucible and was melted at a temperature of 1300° C. for 30 minutes, and thereafter, the melted material was injected in a twin roller and was subjected to quenching, thereby obtaining a glass cullet. The glass cullet was put into the ball mill again and was pulverized until the glass cullet has a particle diameter of less than 10 μm, thereby obtaining a glass frit. Compositional conditions of each component and measured glass transition temperatures Tg are shown in Table 4 below and FIG. 6.

TABLE 4

| Division | Compositional Condition (mol %) | | | | Glass Transition Temperature |
| --- | --- | --- | --- | --- | --- |
| | $SiO_2$ | $B_2O_3$ | ZnO | $K_2O$ | $T_g$ (° C.) |
| Example 18 | 13.6 | 29.1 | 48.2 | 9.1 | 502 |
| Example 19 | 13.6 | 27.1 | 48.2 | 11.1 | 503 |
| Example 20 | 13.6 | 29.1 | 46.2 | 11.1 | 505 |
| Example 21 | 13.6 | 25.1 | 48.2 | 13.1 | 502 |
| Example 22 | 13.6 | 29.1 | 44.2 | 13.1 | 497 |

Examples 25 to 30: Multicomponent Glass Composition

Weighing of the materials of $SiO_2$, $B_2O_3$, ZnO, $Na_2O$, $Al_2O_3$, $K_2O$ and $Li_2O$ was performed, and thereafter, the materials were put in a ball mill and were then mixed for 48 hours. Mixed powder was put in a platinum crucible and was melted at a temperature of 1300 r for 30 minutes, and thereafter, the melted material was injected in a twin roller and was subjected to quenching, thereby obtaining a glass cullet. The glass cullet was put into the ball mill again and was pulverized until the glass cullet has a particle diameter of less than 10 μm, thereby obtaining a glass frit. Compositional conditions of each component are shown in Table 5 below and measured glass transition temperatures Tg and optical properties are shown in Table 6 below.

TABLE 5

| Division | Compositional Condition (mol %) | | | | | | |
| --- | --- | --- | --- | --- | --- | --- | --- |
| | $SiO_2$ | $B_2O_3$ | ZnO | $Na_2O$ | $Al_2O_3$ | $K_2O$ | $Li_2O$ |
| Example 25 | 24 | 30 | 35 | 6 | 1 | 1 | 3 |
| Example 26 | 23 | 30 | 30 | 3 | 1 | 10 | 2 |
| Example 27 | 26 | 30 | 30 | 1 | 1 | 10 | 2 |
| Example 28 | 16 | 31 | 36 | 1 | 2 | 9 | 5 |
| Example 29 | 15 | 30 | 35 | 4 | 2 | 9 | 5 |
| Example 30 | 14 | 35 | 34 | 1 | 2 | 9 | 5 |

TABLE 6

| | Heat Property | Optical Property | |
| --- | --- | --- | --- |
| Division | Glass Transition Temperature (° C.) | Light Efficiency | Color Temperature CCT (K) | Color Rendering Index (CRI) |
| Example 25 | 478 | 172 | 3218 | 79 |
| Example 26 | 487 | 170 | 3033 | 75 |
| Example 27 | 500 | 174 | 3308 | 80 |
| Example 28 | 475 | 177 | 3090 | 80 |
| Example 29 | 470 | 169 | 2991 | 76 |
| Example 30 | 460 | 173 | 3064 | 76 |

Comparative Examples 1 to 10: Quinary Glass Composition

Weighing of the materials of $SiO_2$, $B_2O_3$, ZnO, $Na_2O$, $K_2O$ and $Li_2O$ was performed, and thereafter, the materials were put in a ball mill and were then mixed for 48 hours. Mixed powder was put in a platinum crucible and was melted at a temperature of 1300 r for 30 minutes, and thereafter, the melted material was injected in a twin roller and was subjected to quenching, thereby obtaining a glass cullet. The glass cullet was put into the ball mill again and was pulverized until the glass cullet has a particle diameter of less than 10 μm, thereby obtaining a glass frit. Compositional conditions of each component are shown in Table 7 below.

TABLE 7

| Division | Composition (mol %) | | | | | | Whether or not vitrification is performed |
|---|---|---|---|---|---|---|---|
| | $SiO_2$ | $B_2O_3$ | ZnO | $Li_2O$ | $Na_2O$ | $K_2O$ | |
| Comparative Example 1 | 10 | 34 | 56 | 10 | 10 | — | Phase separation |
| Comparative Example 2 | 10 | 34 | 56 | 10 | — | 10 | Phase separation |
| Comparative Example 3 | 10 | 34 | 56 | — | 10 | 10 | Devitrification |
| Comparative Example 4 | 10 | 34 | 56 | 5 | 10 | — | Phase separation |
| Comparative Example 5 | 10 | 34 | 56 | 5 | — | 10 | Devitrification |
| Comparative Example 6 | 15 | 32 | 53 | 10 | 10 | — | Phase separation |
| Comparative Example 7 | 15 | 32 | 53 | 10 | — | 10 | Difficulty in firing |
| Comparative Example 8 | 15 | 32 | 53 | — | 10 | 10 | Devitrification |
| Comparative Example 9 | 15 | 32 | 53 | 5 | 10 | — | Difficulty in firing |
| Comparative Example 10 | 15 | 32 | 53 | 5 | — | 10 | Devitrification |

Production Example

Production Example 1

7 mol % of a LuAg phosphor in the range of 530 to 560 nm and 2 mol % of a nitride phosphor in the range of 630 to 690 nm were added to the glass frit produced in Example 29 and were sufficiently mixed. The obtained mixture was put into a SUS mold (having a molded material thickness of 1000 μm) and was subjected to uniaxial compression at 5 tons for 5 minutes, thereby obtaining a compressed molded material. The compressed molded material was subjected to firing in a firing furnace at a temperature of 630° C. for 30 minutes, and was then subjected to mirror-like surface processing so as to have a surface roughness of 0.2 μm, thereby obtaining a phosphor plate.

An integrating sphere for a test was produced with the obtained phosphor plate, and light efficiency was observed. The results thereof are shown in FIG. 7.

2. Glass Composition for Photo-Conversion Member (Oxide Containing a Metal of Group I or Group II of the Table)

The glass composition for the photo-conversion member will be hereinafter described based on examples different from the aforesaid examples. In general, a phosphor used in a phosphor plate is limited to an oxide phosphor, in particular, an yttrium aluminum garnet (YAG)-based phosphor. When merely the oxide phosphor is used, it is difficult to implement various color coordinates and color temperatures. Also, when merely the oxide phosphor such as the YAG-based phosphor is applied, it is required that a heat resistant temperature is 800° C. or more. Thus, the compositional condition of glass is not needed to become complicated. However, in order to implement various color temperatures, a blue phosphor and a yellow phosphor should be mixed in an appropriate amount. To do so, the compositional condition of glass should be adjusted by adding an alkali metal or an alkali earth metal to the glass composition so that a sintering temperature can be reduced because the phosphors are vulnerable to heat.

However, the transmittance of glass may be reduced and a whitening phenomenon in which the glass becomes hazy may be generated due to a reaction between water and the compositional component of the glass due to properties of the material when the glass is used for a long time (see FIG. 10, (A) of FIG. 10 shows a state of the phosphor plate before putting the phosphor plate into the test of reliability under a high-temperature and humidity environment, and (B) of FIG. 10 shows a state of the phosphor plate after putting the phosphor plate into the test of reliability under a high-temperature and humidity environment). Elements based on B, Na and Li may have an influence on the whitening phenomenon. However, in particular, it is known that the element of Na enables a hydrate to be easily formed. FIG. 12 shows a mechanism in which a whitening phenomenon is generated by formation of the hydrate caused by moisture and glass elements, in particular, Na. As such, due to the formation of corrosion and the hydrate, a step difference of about 5 to 8 μm is generated on a surface (the right photo of FIG. 11).

Meanwhile, another factor, which causes acceleration of the whitening phenomenon, is pores formed in the inside of the phosphor plate. FIG. 12 is an SEM photo resulting from capturing pores generated on a surface of the phosphor plate. When a large amount of pores are generated, a reaction area is increased by the increase of a surface area. Thus, this may be a factor that may cause the acceleration of whitening.

Accordingly, in the present embodiment, the content of an oxide mixture composed of $SiO_2$, $B_2O_3$ and ZnO, an oxide including at least one oxide of oxides containing metals of group I and group II, and an oxide containing $B_2O_3$ and the metals of group I and group II is 35 wt % or less based on a total weight of the composition.

The oxide mixture composed of $SiO_2$, $B_2O_3$ and ZnO is a material that forms the most basic structure when manufacturing the glass via vitrification of the glass composition, and belongs to a network forming oxide or a mesh forming oxide among oxides that form the glass. The oxide mixture is the most basic component of the glass, and a duodenary glass may be produced by merely the composition. In the oxide mixture, a ratio of $SiO_2$, $B_2O_3$ and ZnO may be 1:1.5:4 to 1:2.5:5. However, $SiO_2$ and ZnO in the oxide mixture have no influence on the whitening phenomenon of the phosphor plate. Meanwhile, a content of $B_2O_3$ may serve as a main factor that causes the whitening phenomenon. Accordingly, a content of $B_2O_3$ may be 25 wt % or less based on the total weight of the glass composition.

In the present embodiment, the oxide containing the metals of group I and group II may be $Na_2O$, $K_2O$, $Li_2O$, BaO, SrO, CaO, or a mixture of at least two oxides thereof. The oxide containing the metals of group I and group II functions to reduce a glass transition temperature Tg of glass obtained after vitrification of the composition. When the glass transition temperature Tg is low, a sintering temperature maybe reduced upon manufacturing the phosphor plate. However, the oxide containing the metal of group I or group II may serve as a factor that reduces vitrification or causes whitening when an amount of the added oxide is increased. Accordingly, the oxide containing the metal of group I or group II may be controlled to have a content of 15 wt % or less. Also, a total content of the oxide containing the metal of group I or group II serving as the factor of whitening and a content of $B_2O_3$ may be 35 wt % or less based on the total weight of the glass composition.

The ceramic phosphor plate according to another aspect of the present embodiment has a glass frit obtained by vitrification of the glass composition described above as a matrix and contains at least one phosphor.

The glass frit is obtained by vitrification and pulverization of the glass composition including the oxide mixture composed of $SiO_2$, $B_2O_3$ and ZnO and the oxide containing at least one metal of group I or group II.

The glass frit is mixed with the glass composition including an oxide mixture composed of $SiO_2$, $B_2O_3$ and ZnO, at least one carbonate compound containing an alkali metal, and an aluminum oxide for 40 to 50 hours using a ball mill, and then the mixture is put in a melting furnace. The melting temperature may be adjusted according to each compositional condition of the glass composition. At this time, the melting temperature may be 1300 to 1600° C., and glass may be produced according to the conventional glass process. A temperature, which enables raw materials contained in the glass composition to dissolve, is selected, thereby performing melting. At this time, when the temperature is increased by more than 1600° C., the amount of volatile components may be increased. The melted material is injected into a twin roll and is subjected to quenching, thereby preparing a glass cullet. The glass cullet is pulverized to prepare a glass frit.

The pulverizing method is divided into a dry pulverization method and a wet pulverization method. Examples of the dry pulverization method include methods using a ball mill, a vibration mill and the like. $Al_2O_3$ or $ZrO_2$ is generally used in a ceramic ball used in the ball mill method. Since the vibration mill method uses a vibration movement, the vibration mill has a large impact generated when the vibration mill is caught on a pulverized material. The wet pulverization method is a method of performing pulverization by stirring the pulverized material in a fluid and a ball. The wet pulverization may enable fine pulverizing compared to the dry pulverization. In addition to the ball mill, a medium agitation mill and a bead mill are used. The bead mill is a pulverizer in which a ceramic bead having a diameter of 0.5 to 2.0 mm and high wear resistance is used. An organic solvent such as water or ethanol may be used as the liquid used in the wet pulverization. In the case of glass having high water resistance, water is mainly used. In a case where a change in components may be generated upon using water, an organic solvent may be used.

In the present embodiment, an average particle diameter of the glass frit may be 1 to 20 μm, and preferably, 2 to 12 μm. As shown in FIG. 15, when a particle diameter of the glass frit is small, internal porosity after sintering is reduced so that an optical property can be improved. In a case where the particle diameter of the glass frit is more than 20 μm, various pores may be formed upon performing sintering by mixing the glass frit with a phosphor later. On the contrary, when the particle diameter of the glass frit is less than 1 μm, the glass frit may not be sufficiently dispersed upon mixing with the phosphor. Thus, passivation of the phosphor may not be sufficiently performed. Furthermore, according to a milling time increase, since the degree of pollution is increased, it is difficult to maintain a whiteness index after sintering.

According to a desired optical property, the color of lighting, an application field and the like, the ceramic phosphor may be one phosphor of a yellow phosphor, a green phosphor and a red phosphor. According to circumstances, the ceramic phosphor may be at least two kinds of phosphors in which beams having different wavelengths are excited. An yttrium aluminum garnet (YAG)-based phosphor, a lutetium aluminum garnet (LuAG)-based phosphor, a nitride-based phosphor, a sulfide-based phosphor or a silicate-based phosphor may be used as the ceramic phosphor.

The ceramic phosphor is mixed so as to have a content of 1 to 15 wt % based on a total weight of the glass frit. At this time, the mixed amount of the phosphor may be slightly changed according to transmittance and a color difference after sintering. Also, according to a change of the thickness, the content of the phosphor is changed. When the thickness is increased, the content of the phosphor may be reduced.

The mixture of the glass frit and the ceramic phosphor are injected into a SUS (Stainless Use Steel) mold and are subjected uniaxial compression so as to have a plate or disc-like shape. At this time, the compression is performed at 7 tons for 5 minutes. The compressed mixture of the inorganic phosphor and the glass powder is put in a firing furnace and is subjected to firing. At this time, a temperature and time for firing may be adjusted according to each glass transition temperature Tg of the inorganic phosphor and the glass powder.

The ceramic phosphor plate subjected to sintering may be further subjected to surface polishing in order to adjust a thickness and a surface roughness appropriate for properties required in the present embodiment. At this time, polishing is performed so that the ceramic phosphor plate can have a thickness of 200 to 1000 μm and a surface roughness of 0.1 to 0.3 μm.

FIG. 14 is a cross-sectional view showing an integrating sphere intended for measuring an optical property of a ceramic phosphor plate according to an embodiment of the present disclosure.

Referring to FIG. 14, light scattered by the interior of the integrating sphere is evenly distributed over all angles, and the integrating sphere enables the light to be distributed on a surface of the integrating sphere with the regular intensity of illumination by entirely collecting light reflected from the surface of a sample. A special paint, a PTFE (polytetrafluoroethylene) or the like may be used as a coating material for an internal wall of the integrating sphere. The interior of the integrating sphere should not be contaminated. In the case of spectral transmittance, when a light transmitted without a sample is 100%, a ratio for completely blocking light using an opaque object such as an iron plate and the like is 0%. When a transmission color has a large dispersion effect in a transmission material, the optical property may be measured using the integrating sphere.

The integrating sphere includes the ceramic phosphor plate 110. The ceramic phosphor plate 110 is provided to be separated from the light source 120. A separation distance between the ceramic phosphor plate and the light source may be 10 to 20 mm. Preferably, the separation distance may range from 12 to 18 mm. When the separation distance is more than 20 mm, light extraction may not be sufficiently performed. On the contrary, when the separation distance is less than 10 mm, the ceramic phosphor plate 110 may cause thermal deformation due to heat generated from the light source 120.

The integrating sphere includes a housing 130 in which a width is gradually increased upwards from a bottom surface with the light source 120 as its center. An optical element for emitting light, such as a solid light emitting element, may be applied as the light source 120. Any one selected from among an LED (Light Emitting Diode), an OLED (Organic Light Emitting Diode), an LD (Laser Diode), a laser, and a VCSEL (Vertical Cavity Surface Emitting Laser) may be applied as the solid light emitting element. The ceramic phosphor plate 110 is provided at an upper end portion of the housing to be separated from a light source 120. As described above, the ceramic phosphor plate 110 includes a matrix composed of a glass frit and a ceramic phosphor dispersed in the matrix. The inside of the housing 132 may be filled with a material having a higher refractive index than that of the ceramic photo-conversion member 110 or the same refractive index as that of the ceramic phosphor plate 110.

The present disclosure will be hereinafter described in greater detail based on examples. The examples have been disclosed for illustrative purposes and the present disclosure may, however, be embodied in different forms and should not be construed as limited to the examples set forth herein.

[Production Example] Production of a Glass Frit

Weighing of oxide and carbonate compound materials was performed as the compositional conditions shown in Table 8 below, and the materials were injected into a ball mill and were then mixed for 48 hours. The mixed powder was put into a platinum crucible and was melted at a temperature of 1300° C. for 30 minutes. Then, the melted material was injected in a twin roller and was subjected to quenching, thereby obtaining a glass cullet. The glass cullet was put in the ball mill again and was pulverized until the glass cullet has a particle diameter of less than 15 μm, thereby obtaining a glass frit.

[Example] Production of a Phosphor Plate 7 mol % of a LuAg phosphor in the range of 530 to 560 nm and 2 mol % of a nitride phosphor in the range of 630 to 690 nm were added to the glass frit produced in the production example and were sufficiently mixed. The obtained mixture was put into a SUS mold (having a molded material thickness of 1000 μm) and was subjected to uni-axial compression at 5 tons for 5 minutes, thereby obtaining a compressed molded material. The compressed molded material was subjected to firing in a firing furnace at a temperature of 630° C. for 30 minutes, and was then subjected to mirror-like surface processing so as to have a surface roughness of 0.2 μm, thereby obtaining a phosphor plate.

Comparative Example

A phosphor plate composed of the compositions shown in Table 8 below was obtained by the same method as that of the production example and the example.

TABLE 8

|  | Example 31 | Comparative Example 11 | Comparative Example 12 | Comparative Example 13 |
| --- | --- | --- | --- | --- |
| $SiO_2$ | 12 | 13 | 14 | 13 |
| $B_2O_3$ | 24 | 23 | 25 | 24 |
| $Na_2O$ | 4 | 7 | 7 | 10 |
| ZnO | 56 | 46 | 48 | 48 |
| $K_2O$ | 0 | 11 | 6 | 0 |
| $Li_2O_3$ | 4 | 0 | 0 | 0 |
| CaO | 0 | 0 | 0 | 5 |
| Total | 100 | 100 | 100 | 100 |
| Total of elements causing whitening | 32 | 41 | 38 | 39 |

※ Unit: wt %

[Test]
(1) Accelerated Life Test (ALT)
Each of the phosphor plates produced in Example 31, Comparative Example 11 and Comparative Example 12 was left in a high temperature and humidity environment for 1000 hours pursuant to the requirements for reliability of an LED, and was then observed using an optical microscope and a scanning electron microscope. The results thereof are shown in Table 9 below.

TABLE 9

|  | Example 31 | Comparative Example 11 | Comparative Example 12 |
| --- | --- | --- | --- |
| Degree of Whitening | 0 | 5 | 3 |
| Porosity (%) | 1.12 | 5.55 | 3.66 |
| Optical microscope photo | (A) of FIG. 15 | (A) of FIG. 16 | (A) of FIG. 17 |
| SEM photo | (B) of FIG. 15 | (B) of FIG. 16 | (B) of FIG. 17 |

※ A whitening phenomenon becomes acute as a value of the degree of whitening becomes near from 0 to 5.

(2) Observation of Ion Elution
Each of the phosphor plates produced in Example 11 and Comparative Examples 11 and 12 was put and left in a distilled water having a temperature of 85° C., and a pH thereof was then observed. The results thereof are shown in FIG. 18.

(3) Inductively Coupled Plasma (ICP) Spectrometry
The ICP spectrometry was performed with the distilled water used upon the observation of ion elution. The results thereof are shown in Table 10 below.

TABLE 10

|  | Distilled water | Example 31 | Comparative Example 11 | Comparative Example 12 |
| --- | --- | --- | --- | --- |
| Li | 0.02 | 0.11 | 0.93 | 0.36 |
| Ca | 0.09 | 10.90 | 7.48 | 10.66 |
| Na | 0.57 | 10.22 | 34.08 | 10.71 |
| B | 0.45 | 2.66 | 27.23 | 4.07 |
| K | 0.35 | 3.68 | 6.13 | 6.57 |
| Si | 0.37 | 4.77 | 6.96 | 4.09 |
| Zn | — | — | — | — |
| Total amount of B, Na, Li, and K eluted ions (mg/kg) | 1.39 | 16.66 | 68.36 | 21.71 |

3. Glass Composition for Photo-Conversion Member (Structure Including a Nonmetallic Material)

According to the present embodiment, a ceramic photo-conversion member having reduced porosity may be implemented so that damage to the product can be reduced by preventing a thermal shock from being generated upon turning on an LED. Furthermore, a glass composition having high efficiency and high heat-resistance can be provided.

FIG. 19 is a photo resulting from observing a cross section of a conventional photo-conversion member using an SEM (Scanning Electron Microscope). As shown in FIG. 19, pores (parts indicated into circles) on a surface or in an inner portion of the photo-conversion member are damaged by a thermal shock or moisture. Thus, in the present embodiment of the present disclosure, this problem can be solved by the glass composition having the following compositional conditions.

The glass composition for the ceramic photo-conversion member according to the present example includes an oxide mixture composed of $SiO_2$, $B_2O_3$ and ZnO, an alkali metal oxide, an alkali earth oxide or a mixture thereof, and an additional nonmetallic oxide.

The oxide mixture composed of $SiO_2$, $B_2O_3$ and ZnO is a material that forms the most basic structure upon manufacturing glass by vitrification of the glass composition. The oxide mixture belongs to a network forming oxide or a mesh forming oxide among oxides that form the glass. The oxide mixture is the most basic component of the glass, and a duodenary glass may be produced by merely the composition. In the oxide mixture, a ratio of $SiO_2$, $B_2O_3$ and ZnO may be 1:1.5:4 to 1:2.5:5.

In the present embodiment, the alkali metal oxide may be $Na_2O$, $Li_2O$, $K_2O$ or a mixture of at least two alkali metal oxides. Also, the alkali earth metal oxide may be BaO, SrO, CaO, or a mixture of at least two alkali earth metal oxides. The alkali metal oxide and the alkali earth metal oxide function to reduce the glass transition temperature Tg of glass obtained after vitrification of the glass composition. When the glass transition temperature Tg is low, a sintering temperature may be reduced upon manufacturing the photoconversion member. The alkali metal oxide may be contained in an amount of 2 to 15 mol % compared to the total composition, and the alkali earth metal oxide may be contained in an amount of 5 to 40 mol % compared to the total composition. However, as the amount of the alkali metal oxide and the amount of the alkali earth metal oxide are gradually increased, this may serve as a factor that reduces vitrification or causes a whitening phenomenon. Accordingly, it is preferable that a total content of the alkali metal oxide and the alkali earth metal oxide does not exceed 50 mol %.

As the additional nonmetallic oxide, 2 to 10 mol % of $P_2O_5$ may be contained in the glass composition. $P_2O_5$ functions to improve transmittance by promoting phase separation for minute and uniform phase slitting and vitrification. When a content of $P_2O_5$ is reduced, transmittance may be reduced. However, this problem may be improved by adding phosphorous oxide. However, since the phosphorous oxide is a component having a high reaction property, when the phosphorous oxide is added in an excessive amount, there is a possibility of having an influence on reliability. Thus, it is preferable that the amount of the phosphorous oxide be not more than 10 mol %.

The ceramic phosphor plate according to a further aspect of the present embodiment has a glass frit obtained by vitrification of the glass composition described above as a matrix and contains at least one phosphor.

The glass frit is obtained by vitrification and pulverization of the glass composition including an oxide mixture composed of $SiO_2$, $B_2O_3$ and ZnO, at least one alkali metal oxide, and an alkali earth oxide, and an additional nonmetallic oxide.

The glass frit is mixed with the glass composition including an oxide mixture composed of $SiO_2$, $B_2O_3$ and ZnO, at least one alkali metal oxide, and an alkali earth oxide, and an additional nonmetallic oxide for 40 to 50 hours using a ball mill, and then the mixture is put in a melting furnace. A melting process can be performed by adjusting a melting temperature according to each compositional condition of the glass composition. At this time, the melting temperature may be 1300 to 1600° C., and glass may be produced according to a conventional glass manufacturing process. The melting process is performed by selecting a temperature for enabling uniform dissolution of the materials contained in the glass composition. At this time, when the temperature is increased by more than 1600° C., the amount of a volatile component may be increased. The melted material is put in a twin roll and is subjected quenching to prepare a glass cullet. The glass frit is prepared by pulverizing the glass cullet.

The pulverizing method is divided into a dry pulverization method and a wet pulverization method. Examples of the dry pulverization method include methods using a ball mill, a vibration mill and the like. $Al_2O_3$ or $ZrO_2$ is generally used in a ceramic ball used in the ball mill method. Since the vibration mill method uses a vibration movement, the vibration mill has a large impact generated when the vibration mill is caught on a pulverized material. The wet pulverization method is a method of performing pulverization by stirring the pulverized material in a fluid and a ball. The wet pulverization may enable fine pulverizing compared to the dry pulverization. In addition to the ball mill, a medium agitation mill and a bead mill are used. The bead mill is a pulverizer in which a ceramic bead having a diameter of 0.5 to 2.0 mm and high wear resistance is used. An organic solvent such as water or ethanol may be used as the liquid used in the wet pulverization. In the case of glass having high water resistance, water is mainly used. In a case where a change in components may be generated upon using water, an organic solvent may be used.

The glass frit according to the present embodiment may have an average particle diameter D50 of 1 to 5 μm, preferably, 2 to 4 μm. When the glass frit has a small particle diameter, internal porosity of the glass frit after sintering is reduced so that damage caused by a thermal shock can be prevented. Also, as porosity is reduced, transmittance is increased so that an optical property can be improved. In a case where the particle diameter of the glass frit is more than 5 μm, various pores may be formed upon performing sintering by mixing the glass frit with a phosphor later. On the contrary, when the particle diameter of the glass frit is less than 1 μm, the glass frit may not be sufficiently dispersed upon mixing with the phosphor. Thus, passivation of the phosphor may not be sufficiently performed. Furthermore, according to a milling time increase, since the degree of pollution is increased, it is difficult to maintain a whiteness index after sintering.

The glass frit according to the present embodiment has a particle size distribution (Span) of 3 or less defined by the following Equation 1.

$$\text{Particle Size Distribution (Span)} = \frac{D90 - D10}{D50} \quad \text{[Equation 1]}$$

In Equation 1 above, D10, D50, and D90 refer to each particle diameter of the points of cumulative curves showing 10%, 50%, and 90% when calculating the cumulative curves of the particle size distribution with respect to 100% of a total weight. Span refers to a width of the particle size distribution and means that the particle size distribution is wide or narrow. When the particle size distribution is small, the glass frit is uniform and minute. The particle size distribution is a factor having a large relation with porosity. The smaller the particle size distribution leads to the better packing among particles so that porosity can be reduced.

The ceramic conversion member according to yet another object of the present disclosure has the glass frit described above as a matrix, is obtained by sintering at least one ceramic phosphor, and has a porosity of 2% or less.

According to a desired optical property, the color of lighting, an application field and the like, the ceramic phosphor may be one phosphor of a yellow phosphor, a green phosphor and a red phosphor. According to circumstances, the ceramic phosphor may be at least two kinds of phosphors in which beams having different wavelengths are excited. An yttrium aluminum garnet (YAG)-based phosphor, a lutetium aluminum garnet (LuAG)-based phosphor, a nitride-based phosphor, a sulfide-based phosphor or a silicate-based phosphor may be used as the ceramic phosphor.

The ceramic phosphor is mixed in an amount of 1 to 10 mol % with respect to the glass frit. At this time, according to each transmittance and color difference after sintering, the amount of the mixed phosphor may be slightly changed. Also, according to the change of a thickness, the content of the phosphor may be changed. When the thickness of the phosphor is increased, the amount of the phosphor may be reduced.

The mixture of the glass frit and the ceramic phosphor is put into a SUS (Stainless Use Steel) mold and is subjected to uniaxial compression to have a plate or disc form. At this time, the compression is performed at 5 to 10 tons for 1 to 10 minutes. The mixture of the compressed inorganic phosphor-glass powder is subjected to firing in a state of being put in a firing furnace. A temperature and time for firing may be adjusted according to each glass transition temperature Tg of the inorganic phosphor and the glass powder.

The ceramic photo-conversion member subjected to sintering may be further subjected to surface polishing in order to adjust a thickness and a surface roughness appropriate for properties required in the embodiment. At this time, the ceramic photo-conversion member is ground until the ceramic photo-conversion member has a thickness of 200 to 1000 μm and a surface roughness of 0.1 to 0.3 μm.

FIG. 20 is a cross-sectional view of an integrating sphere for measuring an optical property of a ceramic photo-conversion member according to another embodiment of the present disclosure.

Referring to FIG. 20, light scattered by the interior of the integrating sphere is evenly distributed over all angles, and the integrating sphere enables the light to be distributed on a surface of the integrating sphere with the regular intensity of illumination by entirely collecting light reflected from the surface of a sample. A special paint, a PTFE (polytetrafluoroethylene) or the like may be used as a coating material for an internal wall of the integrating sphere. The interior of the integrating sphere should not be contaminated. In the case of spectral transmittance, when a light transmitted without a sample is 100%, a ratio for completely blocking light using an opaque object such as an iron plate and the like is 0%. When a transmission color has a large dispersion effect in a transmission material, the optical property may be measured using the integrating sphere.

The integrating sphere includes the ceramic photo-conversion member 110. The ceramic photo-conversion member 110 is provided to be separated from the light source 120. A separation distance between the ceramic photo-conversion member and the light source may be 10 to 20 mm. Preferably, the separation distance may range from 12 to 18 mm. When the separation distance is more than 20 mm, light extraction may not be sufficiently performed. On the contrary, when the separation distance is less than 10 mm, the ceramic photo-conversion member 110 may cause thermal deformation due to heat generated from the light source 120.

The integrating sphere includes a housing 130 in which a width is gradually increased upwards from a bottom surface with the light source 120 as its center. An optical element for emitting light, such as a solid light emitting element, may be applied as the light source 120. Any one selected from among an LED (Light Emitting Diode), an OLED (Organic Light Emitting Diode), an LD (Laser Diode), a laser, and a VCSEL (Vertical Cavity Surface Emitting Laser) may be applied as the solid light emitting element. The ceramic photo-conversion member 110 is provided at an upper end portion of the housing to be separated from a light source 120. As described above, the ceramic photo-conversion member 110 includes a matrix composed of a glass frit and a ceramic phosphor dispersed in the matrix. The inside of the housing 132 may be filled with a material having a higher refractive index than that of the ceramic photo-conversion member 110 or the same refractive index as that of the ceramic phosphor plate 110.

The present disclosure will be hereinafter described in greater detail based on examples. The examples have been disclosed for illustrative purposes and the present disclosure may, however, be embodied in different forms and should not be construed as limited to the examples set forth herein.

Production Example

Production Example: Production of Glass Frit

After weighing oxide and carbonate compound materials as the compositional conditions shown in Table 1 below, the materials were then injected into a ball mill and were mixed for 48 hours. Mixed powder was put in a platinum crucible and was melted at a temperature of 1300° C. for 30 minutes, and thereafter, the melted material was injected in a twin roller and was subjected to quenching, thereby obtaining a glass cullet. The glass cullet was put into the ball mill again and was pulverized until the glass cullet has a particle diameter of 5 μm or less, thereby obtaining a glass frit.

The degree of particle-size distribution of the obtained glass frit was measured. The results thereof are shown in FIG. 21 and Table 11 below.

Comparative Production Example

Comparative Production Examples 1 and 2: Production of a Glass Frit

A glass cullet was produced by the same method as that of the production example. The glass cullet was pulverized until the glass cullet has an average particle diameter of 10 to 15 μm, thereby obtaining the glass frit.

The degree of particle-size distribution of the obtained glass frit was measured. The results thereof are shown in FIG. 21 and Table 11 below.

TABLE 11

| | Example 32 | Example 33 | Example 34 |
|---|---|---|---|
| $SiO_2$ | 12 | 13 | 14 |
| $B_2O_3$ | 24 | 23 | 25 |
| $Na_2O$ | 4 | 7 | 7 |
| ZnO | 56 | 46 | 48 |
| $K_2O$ | 0 | 11 | 6 |
| $Li_2O_3$ | 4 | 0 | 0 |
| CaO | 0 | 0 | 0 |
| Total | 100 | 100 | 100 |

※ Unit of the content of each component: mole %

TABLE 12

|  | D10 | D50 | D90 | Span |
|---|---|---|---|---|
| Production Example | 1.1 | 3.6 | 10.4 | 2.6 |
| Comparative Production Example 1 | 2.8 | 20.1 | 65.4 | 3.1 |
| Comparative Production Example 2 | 1.6 | 7.3 | 32.8 | 4.3 |

Example: Production of a Photo-Conversion Member 7 mol % of a LuAg phosphor in the range of 530 to 560 nm and 2 mol % of a nitride phosphor in the range of 630 to 690 nm were added to the glass frit produced in the production example and were sufficiently mixed in a state of being injected into a ball mill. The obtained mixture was put into a SUS mold (having a molded material thickness of 1000 μm) and was subjected to uniaxial compression at 5 tons for 5 minutes, thereby obtaining a compressed molded material. The compressed molded material was subjected to firing in a firing furnace at a temperature of 630° C. for 30 minutes, and was then subjected to mirror-like surface processing so as to have a surface roughness of 0.2 μm, thereby obtaining a photo-conversion member.

Comparative Example

Comparative Examples 14 and 15: Production of a Photo-Conversion Member

The photo-conversion member was obtained by the same method as that of the example with the respective glass frits produced in Comparative Production Examples 14 and 15.
[Evaluation]
The Observation of Porosity and Transmittance
The photo-conversion members produced in Comparative Examples 14 and 15 were observed using an optical microscope and a scanning electron microscope (SEM). The results thereof are shown in Table 13 below.

TABLE 13

|  | Example | Comparative Example 14 | Comparative Example 15 |
|---|---|---|---|
| Light Transmittance (%) | 53 | 45 | 50 |
| Porosity (%) | 1.21 | 5.55 | 3.66 |
| Optical microscope photo | (B) of FIG. 22 | (B) of FIG. 23 | (B) of FIG. 24 |
| SEM photo | (B) of FIG. 22 | (B) of FIG. 23 | (B) of FIG. 24 |

As set forth above, according to some embodiments of the present disclosure, the ternary glass composition may include $SiO_2$, $B_2O_3$ and ZnO, wherein B2O3 is contained in a content of 30 to 45 mol % in the glass composition, and ZnO is contained in a content of 40 to 60 mol % in the glass composition. Also, the glass frit for the ceramic photo-conversion member may be obtained by vitrification and pulverization of the multicomponent glass composition containing an oxide mixture composed of SiO2, B2O3 and ZnO, and 5 to 25 mol % of at least one alkali metal oxide. Thus, it is advantageous in that various glass compositional conditions required in various fields to which the phosphor plate is applied can be adjusted, thereby improving a wetting property with a phosphor and fluidity upon sintering.

Also, according to some embodiments of the present disclosure, the glass composition for a photo-conversion element may include: an oxide mixture composed of $SiO_2$, $B_2O_3$ and ZnO; and at least one oxide of oxides containing a metal of group I or group II, wherein the oxide containing $B_2O_3$ and the oxide containing the metal of group I or group II have a content of 35 wt % or less based on the total weight of the glass composition. Furthermore, the ceramic phosphor plate may include, as a matrix, a glass frit obtained by vitrification of the glass composition for the photo-conversion element and may be obtained by sintering at least one phosphor. Thus, it is advantageous in that compositional conditions, which are main factors causing whitening, can be controlled, porosity of the phosphor plate can be reduced by controlling a particle diameter of the glass frit, thereby minimizing whitening. Also, the reliability of LED lighting and a package for a vehicle required to have long-term reliability and high power can be secured.

According to some embodiments of the present disclosure, the glass composition for the ceramic photo-conversion member may include: an oxide mixture composed of $SiO_2$, $B_2O_3$ and ZnO; and at least one oxide of oxides containing a metal of group I or group II, wherein the oxide containing $B_2O_3$ and the oxide containing the metal of group I or group II are contained in a content of 35 mol % or less in the total composition, and the glass frit may be obtained by vitrification and pulverization of the composition. Thus, it is advantageous in that the ceramic photo-conversion member having reduced porosity can be implemented so that damage to the product can be reduced by preventing a thermal shock from being generated upon turning on an LED, thereby enabling implementation of high efficiency and high heat-resistance.

The present disclosure has been made keeping in mind the above problems, an aspect of embodiments of the present disclosure provides a ternary glass composition including $SiO_2$, $B_2O_3$ and ZnO, wherein $B_2O_3$ is contained in a content of 30 to 45 mol % in the glass composition, and ZnO is contained in a content of 40 to 60 mol % in the glass composition. Also, another aspect of embodiments of the present disclosure provides a glass frit for a ceramic photo-conversion member that is obtained by vitrification and pulverization of a multicomponent glass composition containing an oxide mixture composed of $SiO_2$, $B_2O_3$ and ZnO, and 5 to 25 mol % of at least one alkali metal oxide.

Also, a further aspect of embodiments of the present disclosure provides a glass composition for a photo-conversion element, including: an oxide mixture composed of $SiO_2$, $B_2O_3$ and ZnO; and at least one oxide of oxides containing a metal of group I or group II, wherein the oxide containing $B_2O_3$ and the oxide containing the metal of group I or group II have a content of 35 wt % or less based on the total weight of the composition, and also provides a ceramic phosphor plate including a glass frit obtained by vitrification of the glass composition for the photo-conversion member as a matrix and obtained by sintering at least one phosphor.

Also, yet another aspect of embodiments of the present disclosure provides a glass composition for a ceramic photo-conversion member, including: an oxide mixture composed of $SiO_2$, $B_2O_3$ and ZnO; and at least one oxide of oxides containing a metal of group I or group II, wherein the oxide containing $B_2O_3$ and the oxide containing the metal of group I or group II are contained in a content of 35 mol % or less in the total composition.

According to an aspect of embodiments of the present disclosure, a ternary glass composition may include $SiO_2$, $B_2O_3$ and ZnO, wherein $B_2O_3$ is contained in a content of 30 to 45 mol % in the glass composition, and ZnO is contained in a content of 40 to 60 mol % in the glass composition. Also, a glass frit for a ceramic photo-conversion member may be obtained by vitrification and pulverization of a multicomponent glass composition containing an oxide mixture composed of $SiO_2$, $B_2O_3$ and ZnO, and 5 to 25 mol % of at least one alkali metal oxide. Also, according to another aspect of embodiments of the present disclosure, a ceramic photo-conversion member may include a glass frit.

According to a further aspect of embodiments of the present disclosure, a glass composition for a photo-conversion element may include: an oxide mixture composed of $SiO_2$, $B_2O_3$ and ZnO; and at least one oxide of oxides containing a metal of group I or group II, wherein the oxide containing $B_2O_3$ and the oxide containing the metal of group I or group II have a content of 35 wt % or less based on the total weight of the glass composition.

Also, according to yet another aspect of embodiments of the present disclosure, a ceramic phosphor plate may include, as a matrix, a glass frit obtained by vitrification of a glass composition for a photo-conversion element and may be obtained by sintering at least one phosphor.

Also, according to still another aspect of embodiments of the present disclosure, a glass composition for a ceramic photo-conversion member may include: an oxide mixture composed of $SiO_2$, $B_2O_3$ and ZnO; and at least one oxide of oxides containing a metal of group I or group II, wherein the oxide containing $B_2O_3$ and the oxide containing the metal of group I or group II are contained in a content of 35 mol % or less in the total composition.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A photo-conversion member comprising:
    a glass frit comprising an oxide mixture that includes:
        $SiO_2$, $B_2O_3$, and ZnO;
        an alkali metal oxide;
        an optional alkaline earth metal oxide;
        an additional nonmetallic oxide; and
        a trivalent metal oxide; and
    a phosphor mixed in an amount of 1 to 10 mol % with respect to the glass frit,
    wherein the photo-conversion member has a thickness of 200 to 1000 μm and a surface roughness of 0.1 to 0.3 μm, and
    wherein the glass frit has an average particle diameter between of 1 to 5 μm, and the photo-conversion member has a porosity of 2% or less,
    wherein a content of the $SiO_2$ is greater than 25 mol % and less than 40 mol % to the total composition,
    wherein the alkali metal oxide is at least two oxides selected from the group consisting of $Na_2O$, $Li_2O$, and $K_2O$ and is contained in an amount of greater than 20 mol % and less than 25 mol % compared to the total composition, and
    wherein the trivalent metal oxide is $Al_2O_3$ and is contained in an amount of greater than 0 mol % and less than 2 mol % compared to the total composition.

2. The photo-conversion member of claim 1, wherein the alkaline earth metal oxide is at least one oxide selected from the group consisting of BaO, SrO, CaO, and a mixture thereof.

3. The photo-conversion member of claim 1, wherein a molar ratio of $SiO_2$, $B_2O_3$ and ZnO is 1:1.5:4 to 1:2.5:5.

4. The photo-conversion member of claim 1, wherein the alkaline earth metal oxide is at least one oxide selected from the group consisting of BaO, SrO, CaO, and a mixture thereof and is contained in an amount of 5 to 30 mol % compared to the total composition.

5. The photo-conversion member of claim 1, wherein the additional nonmetallic oxide is $P_2O_5$.

6. The photo-conversion member of claim 5,
    wherein the glass frit has a particle size distribution (span) of 3 or less defined by the following Equation 1:

$$\text{Particle Size Distribution (Span)} = \frac{D90 - D10}{D50} \quad \text{[Equation 1]}$$

wherein, D10, D50, and D90 refer to each particle diameter of the points of cumulative curves showing 10%, 50%, and 90% when calculating the cumulative curves of the particle size distribution with respect to 100% of a total weight.

7. The photo-conversion member of claim 6, wherein the photo-conversion member is obtained by sintering the glass frit and the phosphor.

8. The photo-conversion member of claim 1, wherein the glass frit has an average particle diameter of 2 to 4 μm.

9. The photo-conversion member of claim 1, wherein a light efficiency of the photo-conversion member is 168.64 of more.

10. The photo-conversion member of claim 1, wherein the phosphor is at least one phosphor selected from the group consisting of an yttrium aluminum garnet (YAG)-based phosphor, a lutetium aluminum garnet (LuAG)-based phosphor, a nitride-based phosphor, a sulfide-based phosphor, and a silicate-based phosphor.

11. The photo-conversion member of claim 10, wherein the lutetium aluminum garnet (LuAG)-based phosphor is mixed in an amount of 7 mol % with respect to the glass frit.

* * * * *